(12) United States Patent
Machida

(10) Patent No.: US 8,810,703 B2
(45) Date of Patent: Aug. 19, 2014

(54) SOLID-STATE IMAGE PICKUP DEVICE, DRIVING METHOD OF SOLID-STATE IMAGE PICKUP DEVICE, AND ELECTRONIC DEVICE

(75) Inventor: Takashi Machida, Kanagawa (JP)

(73) Assignee: Sony Corporation, Tokyo (JP)

( * ) Notice: Subject to any disclaimer, the term of this patent is extended or adjusted under 35 U.S.C. 154(b) by 103 days.

(21) Appl. No.: 13/070,619

(22) Filed: Mar. 24, 2011

(65) Prior Publication Data

US 2011/0242386 A1 Oct. 6, 2011

(30) Foreign Application Priority Data

Mar. 31, 2010 (JP) .................................. 2010-080525

(51) Int. Cl.
*H04N 5/335* (2011.01)

(52) U.S. Cl.
USPC ........................................................ 348/308

(58) Field of Classification Search
USPC .......................................... 348/308, 249, 302
See application file for complete search history.

(56) References Cited

U.S. PATENT DOCUMENTS

| 5,349,216 | A  | * | 9/1994  | Lee et al. ........................ 257/230 |
| 7,473,977 | B2 | * | 1/2009  | Kitano et al. .................. 257/435 |
| 7,804,534 | B2 | * | 9/2010  | Nagase et al. ................. 348/249 |
| 2004/0051801 | A1 | * | 3/2004  | Iizuka et al. ................... 348/294 |
| 2004/0119865 | A1 | * | 6/2004  | Okada et al. .................. 348/311 |
| 2007/0229689 | A1 | * | 10/2007 | Yamada ......................... 348/311 |
| 2009/0251582 | A1 | * | 10/2009 | Oike ............................. 348/308 |

FOREIGN PATENT DOCUMENTS

JP 2009-268083 11/2009

* cited by examiner

*Primary Examiner* — Aung S Moe
*Assistant Examiner* — Amy Hsu
(74) *Attorney, Agent, or Firm* — Dentons US LLP

(57) ABSTRACT

A solid-state image pickup device includes: a plurality of unit pixels including at least a photoelectric converting section, a charge-to-voltage converting section, and one or more transfer means for transferring a charge in a predetermined path; a light shielding film for shielding a surface of the plurality of unit pixels excluding at least a light receiving section of the photoelectric converting section from light; and voltage controlling means for controlling a voltage applied to the light shielding film; wherein transfer of the charge by one of the transfer means is controlled by controlling the voltage applied to the light shielding film.

10 Claims, 29 Drawing Sheets

SOLID-STATE IMAGE PICKUP DEVICE, DRIVING METHOD OF SOLID-STATE IMAGE PICKUP DEVICE, AND ELECTRONIC DEVICE

BACKGROUND OF THE INVENTION

1. Field of the Invention

The present invention relates to a solid-state image pickup device, a driving method of a solid-state image pickup device, and an electronic device, and particularly to a solid-state image pickup device, a driving method of a solid-state image pickup device, and an electronic device that are capable of a global shutter.

2. Description of the Related Art

In related art, a rolling shutter (focal-plane shutter) system has spread as a system of an electronic shutter for a CMOS image sensor. In the rolling shutter system, signal resetting is performed by sequentially scanning a large number of pixels arranged two-dimensionally in units of pixel rows, and thus there occurs a difference in exposure period in each pixel row. As a result, a distortion occurs in an image photographed when a subject is moving, for example. When a vertically straight object moving in a horizontal direction is photographed, for example, the object appears to be inclined.

Accordingly, an all-pixel simultaneous electronic shutter for a CMOS high-speed image sensor has been developed (see Japanese Patent Laid-Open No. 2009-268083, for example). The all-pixel simultaneous electronic shutter is to start light exposure simultaneously and end the light exposure simultaneously in all pixels effective in image pickup. The all-pixel simultaneous electronic shutter is referred to also as a global shutter (global exposure).

FIGS. 1 to 4 show an example of constitution of a unit pixel of a solid-state image pickup device (CMOS image sensor) capable of the related-art all-pixel simultaneous electronic shutter operation. FIG. 1 shows an example of a sectional constitution of a unit pixel 11 in a direction A-A' shown in FIG. 4. FIG. 2 and FIG. 3 are plan views showing a constitution of the unit pixel 11. However, FIG. 2 shows the constitution excluding a light shielding film 37, and FIG. 3 shows the constitution including the light shielding film 37. Incidentally, FIG. 2 and FIG. 3 do not show an insulating film 36 to facilitate the understanding of the figures. FIG. 4 is a diagram made by adding a path in the direction A-A' to FIG. 3.

The unit pixel 11 has, as a photoelectric conversion element, a photodiode 21 of a buried type formed by burying an N-type buried layer 34 in a P-type well layer 32 formed on an N-type substrate 31, with a P-type layer 33 formed on the side of a substrate surface. The photodiode 21 generates a light charge whose amount corresponds to an amount of incident light (which light charge will hereinafter be referred to simply as a "charge") by photoelectric conversion, and accumulates the charge within the photodiode 21. The unit pixel 11 also includes a first transfer gate (TRX) 22, a memory part (MEM) 23, a second transfer gate (TRG) 24, and a floating diffusion region (FD) 25.

The gate electrode 22A of the first transfer gate 22 is formed so as to cover a part between the photodiode 21 and the memory part 23 and an upper part of the memory part 23 with an insulating film 22B interposed between the gate electrode 22A and the covered parts. A contact 38 for wiring is connected to an upper part on the memory part 23 side of the gate electrode 22A. The first transfer gate 22 transfers the charge accumulated in the photodiode 21 when a transfer pulse TRX is applied to the gate electrode 22A via the contact 38.

The memory part 23 is formed by an N-type buried channel 35 formed under the gate electrode 22A. The memory part 23 accumulates the charge transferred from the photodiode 21 by the first transfer gate 22.

Modulation can be applied to the memory part 23 by disposing the gate electrode 22A in the upper part of the memory part 23 and applying the transfer pulse TRX to the gate electrode 22A. That is, the potential of the memory part 23 is deepened by applying the transfer pulse TRX to the gate electrode 22A. Thereby, an amount of saturation charge of the memory part 23 can be increased as compared with a case where the modulation is not applied.

The gate electrode 24A of the second transfer gate 24 is formed in an upper part between the memory part 23 and the floating diffusion region 25 with the insulating film 24B interposed between the gate electrode 24A and the P-type well layer 32. A contact 39 for wiring is connected to an upper part of the gate electrode 24A. The second transfer gate 24 transfers the charge accumulated in the memory part 23 when a transfer pulse TRG is applied to the gate electrode 24A via the contact 39.

The floating diffusion region 25 is a charge-to-voltage converting part formed of an N-type layer. The floating diffusion region 25 converts the charge transferred from the memory part 23 by the second transfer gate 24 into a voltage. A contact 40 for wiring is connected to an upper part of the floating diffusion region 25.

The unit pixel 11 further includes a reset transistor 26, an amplifying transistor 27, and a selecting transistor 28.

The drain electrode of the reset transistor 26 is connected to a power supply VDB via a contact 44 (FIG. 2). The source electrode of the reset transistor 26 is connected to the floating diffusion region 25. In addition, the gate electrode 26A (FIG. 2) of the reset transistor 26 is connected with a contact 43 for wiring. By applying a reset pulse RST to the gate electrode 26A via the contact 43 and thus turning on the reset transistor 26, the floating diffusion region 25 is reset, and a charge is discharged from the floating diffusion region 25.

The drain electrode of the amplifying transistor 27 is connected to a power supply VDO via a contact 44 (FIG. 2). The gate electrode 27A (FIG. 2) of the amplifying transistor 27 is connected to the floating diffusion region 25 via a contact 45 (FIG. 2). The drain electrode of the selecting transistor 28 is connected to the source electrode of the amplifying transistor 27. The source electrode of the selecting transistor 28 is connected to a vertical signal line 12 via a contact 47 (FIG. 2). In addition, the gate electrode 28A (FIG. 2) of the selecting transistor 28 is connected with a contact 46. By applying a selection pulse SEL to the gate electrode of the selecting transistor 28 via the contact 46 and thus turning on the selecting transistor 28, the unit pixel 11 as an object from which to read out a pixel signal is selected. That is, when the selecting transistor 28 is on, the amplifying transistor 27 outputs the pixel signal indicating the voltage of the floating diffusion region 25 to the vertical signal line 12 via the selecting transistor 28 and the contact 47.

The unit pixel 11 further includes a charge discharging gate (ABG) 29 and a charge discharging part (ABD) 30.

The gate electrode 29A of the charge discharging gate 29 is formed in an upper part between the photodiode 21 and the charge discharging part 30 with an insulating film 29B interposed between the gate electrode 29A and the P-type well layer 32. A contact 41 for wiring is connected to the gate electrode 29A. The charge discharging gate 29 transfers a charge accumulated in the photodiode 21 when a control pulse ABG is applied to the gate electrode 29A via the contact 41.

The charge discharging part 30 is formed by an N-type layer. The charge discharging part 30 is connected to a power supply VDA via the contact 42. The charge transferred from the photodiode 21 to the charge discharging part 30 by the charge discharging gate 29 is discharged to the power supply VDA. The charge discharging gate 29 and the charge discharging part 30 act to prevent an overflow of charge when the photodiode 21 saturates during a readout period after an end of light exposure.

An insulating film 36 having a three-layer structure of an oxide film, a nitride film, and an oxide film is formed in an upper surface of the unit pixel 11. The insulating film 36 also functions as an optical reflection preventing film. The insulating film 36 has openings only in parts where the contacts 38 to 47 are formed.

Further, a light shielding film 37 made of tungsten or the like is formed on an upper surface of the insulating film 36. As shown in FIG. 3, the light shielding film 37 has openings only in parts where a light receiving part of the photodiode 21 and the contacts 38 to 47 are formed.

FIG. 5 is a diagram showing an example of an arrangement of unit pixels 11 in the pixel array section of the solid-state image pickup device to which the unit pixel 11 is applied. Incidentally, in FIG. 5, description of the reference of each part is omitted to facilitate understanding of the figure.

The unit pixels 11 are arranged two-dimensionally in a vertical direction (column direction) and a horizontal direction (row direction). Though not shown in FIG. 5, five driving signal lines are provided for each row, the five driving signal lines being a driving signal line TRG for the gate electrode 22A of the first transfer gate 22, a driving signal line TRX for the gate electrode 24A of the second transfer gate 24, a driving signal line RST for the gate electrode 26A of the reset transistor 26, a driving signal line SEL for the gate electrode 28A of the selecting transistor 28, and a driving signal line ABG for the gate electrode 29A of the charge discharging gate 29.

A driving method of a unit pixel 11 will next be described with reference to FIG. 6. Incidentally, FIG. 6 is a diagram of potentials of the unit pixel 11 at times t1 to t7. In addition, rectangles shown below the letters TRX, TRG, and RST in FIG. 6 indicate states of the transfer pulse TRX, the transfer pulse TRG, and the reset pulse RST. A solid rectangle indicates that the pulse is on. An outline rectangle indicates that the pulse is off.

A period from time t1 to time t3 is an accumulation period for accumulating a charge corresponding to an amount of incident light on an all-pixel simultaneous basis.

Specifically, at time t1, the transfer pulse TRX, the transfer pulse TRG, and the reset pulse RST are turned on on an all-pixel simultaneous basis, so that charges of the photodiode 21, the memory part 23, and the floating diffusion region 25 are discharged. Thereafter, the transfer pulse TRX, the transfer pulse TRG, and the reset pulse RST are turned off, and light exposure is started on an all-pixel simultaneous basis. As shown at time t2, an amount of charge which amount corresponds to an amount of incident light is accumulated in the photodiode 21.

At time t3, the transfer pulse TRX is turned on on an all-pixel simultaneous basis, so that the charge accumulated in the photodiode 21 is transferred to the memory part 23. Then, the transfer pulse TRX is turned off.

A period from time t4 to time t7 is a readout period for reading out the accumulated charge in order in a row unit.

Specifically, at time t4, the reset pulse RST is turned on, so that the floating diffusion region 25 is reset, and a charge is discharged from the floating diffusion region 25. Then, the reset pulse RST is turned off.

At time t5, a pixel signal (hereinafter referred to as a reset signal) indicating the voltage (hereinafter referred to as a reset level) of the floating diffusion region 25 from which the charge has been discharged is read out.

At time t6, the transfer pulse TRG is turned on, so that the charge accumulated in the memory part 23 is transferred to the floating diffusion region 25. Then, the transfer pulse TRG is turned off.

At time t7, a pixel signal (hereinafter referred to as a charge detection signal) indicating a voltage (hereinafter referred to as a signal level) based on the charge accumulated in the floating diffusion region 25 is read out. Thereafter, as required, a return is made to the process of time t1 to start the accumulation period of a next frame.

SUMMARY OF THE INVENTION

The opening parts of the light shielding film 37 for the contacts 38 to 47 are a size larger than the sections of the respective contacts, and a predetermined space is secured between the light shielding film 37 and the contacts, in order to prevent a short circuit between each contact and the light shielding film 37. However, so-called stray light is made incident from the gap between each contact and the light shielding film 37. A charge generated according to the stray light flows into the memory part 23 and the floating diffusion region 25, and causes noise.

The present invention has been made in view of such a situation. It is desirable to improve the light shielding characteristic of the light shielding film of a solid-state image pickup device.

According to an embodiment of the present invention, there is provided a solid-state image pickup device including: a plurality of unit pixels including at least a photoelectric converting section, a charge-to-voltage converting section, and one or more transfer means for transferring a charge in a predetermined path; a light shielding film for shielding a surface of the plurality of unit pixels excluding at least a light receiving section of the photoelectric converting section from light; and voltage controlling means for controlling a voltage applied to the light shielding film; wherein transfer of the charge by one of the transfer means is controlled by controlling the voltage applied to the light shielding film.

The unit pixels can further include a charge discharging section, and transfer of a charge by transfer means for transferring the charge from the photoelectric converting section to the charge discharging section can be controlled by controlling the voltage applied to the light shielding film.

Transfer of a charge by transfer means for transferring the charge from the photoelectric converting section to the charge-to-voltage converting section can be controlled by controlling the voltage applied to the light shielding film.

The unit pixels can further include a charge retaining section, and transfer of a charge by transfer means for transferring the charge from the photoelectric converting section to the charge retaining section can be controlled by controlling the voltage applied to the light shielding film.

An insulating film formed by an oxide film and a nitride film is disposed between the light shielding film and a semiconductor substrate in which the unit pixels are formed, and only the insulating film between a part of the light shielding film, the part of the light shielding film forming transfer means controlled for charge transfer by the voltage applied to the light shielding film, and the semiconductor substrate is formed by an oxide film alone.

The solid-state image pickup device can further include wiring for connecting the light shielding film and the voltage controlling means to each other on an outside of a pixel array section in which the plurality of unit pixels are arranged, and applying the voltage to the light shielding film.

The solid-state image pickup device can further include wiring for connecting the light shielding film and the voltage controlling means to each other within a pixel array section in which the plurality of unit pixels are arranged, and applying the voltage to the light shielding film.

According to an embodiment of the present invention, there is provided a driving method of a solid-state image pickup device, the solid-state image pickup device including a plurality of unit pixels including at least a photoelectric converting section, a charge-to-voltage converting section, and one or more transfer means for transferring a charge in a predetermined path, and a light shielding film for shielding a surface of the plurality of unit pixels excluding at least a light receiving section of the photoelectric converting section from light, the driving method including the solid-state image pickup device controlling transfer of the charge by one of the transfer means by controlling the voltage applied to the light shielding film.

The unit pixels can further include a charge discharging section, and the solid-state image pickup device can control transfer of a charge by transfer means for transferring the charge from the photoelectric converting section to the charge discharging section by controlling the voltage applied to the light shielding film.

The solid-state image pickup device can control transfer of a charge by transfer means for transferring the charge from the photoelectric converting section to the charge-to-voltage converting section by controlling the voltage applied to the light shielding film.

The unit pixels can further include a charge retaining section, and the solid-state image pickup device can control transfer of a charge by transfer means for transferring the charge from the photoelectric converting section to the charge retaining section by controlling the voltage applied to the light shielding film.

According to an embodiment of the present invention, there is provided an electronic device including a solid-state image pickup device, wherein the solid-state image pickup device includes: a plurality of unit pixels including at least a photoelectric converting section, a charge-to-voltage converting section, and one or more transfer means for transferring a charge in a predetermined path; a light shielding film for shielding a surface of the plurality of unit pixels excluding at least a light receiving section of the photoelectric converting section from light; and voltage controlling means for controlling a voltage applied to the light shielding film; and the solid-state image pickup device controls transfer of the charge by one of the transfer means by controlling the voltage applied to the light shielding film.

In an embodiment of the present invention, in a solid-state image pickup device including a plurality of unit pixels including at least a photoelectric converting section, a charge-to-voltage converting section, and one or more transfer means for transferring a charge in a predetermined path, and a light shielding film for shielding a surface of the plurality of unit pixels excluding at least a light receiving section of the photoelectric converting section from light, a voltage applied to the light shielding film is controlled, and transfer of the charge by one of the transfer means is controlled.

According to an embodiment of the present invention, it is possible to improve the light shielding characteristic of the light shielding film of a solid-state image pickup device.

DETAILED DESCRIPTION OF THE PREFERRED EMBODIMENTS

A mode for carrying out the invention (which mode will hereinafter be referred to as embodiments) will hereinafter be described. Incidentally, description will be made in the following order.
1. First Embodiment (Example of Substituting Light Shielding Film for Gate Electrode of Charge Discharging Part)
2. Second Embodiment (Example of Forming Light Shielding Film near Charge Discharging Gate by Oxide Film Alone)
3. Third Embodiment (Example without Memory Part)
4. Fourth Embodiment (Example of Providing Overflow Path between Photodiode and Memory Part)
5. Fifth Embodiment (Example of Making Memory Part Have Similar Constitution to That of Floating Diffusion Region)
6. Sixth Embodiment (Example of Forming Memory Part by Buried Channel)
7. Seventh Embodiment (Example of Two-Stage Configuration of Memory Part)
8. Eighth Embodiment (Example of Substituting Light Shielding Film for Gate Electrode of First Transfer Gate)
9. Examples of Modification <1. First Embodiment>

A first embodiment of the present invention will be described with reference to FIGS. 7 to 13.

[Example of Constitution of Solid-State Image Pickup Device]

Figure 7:
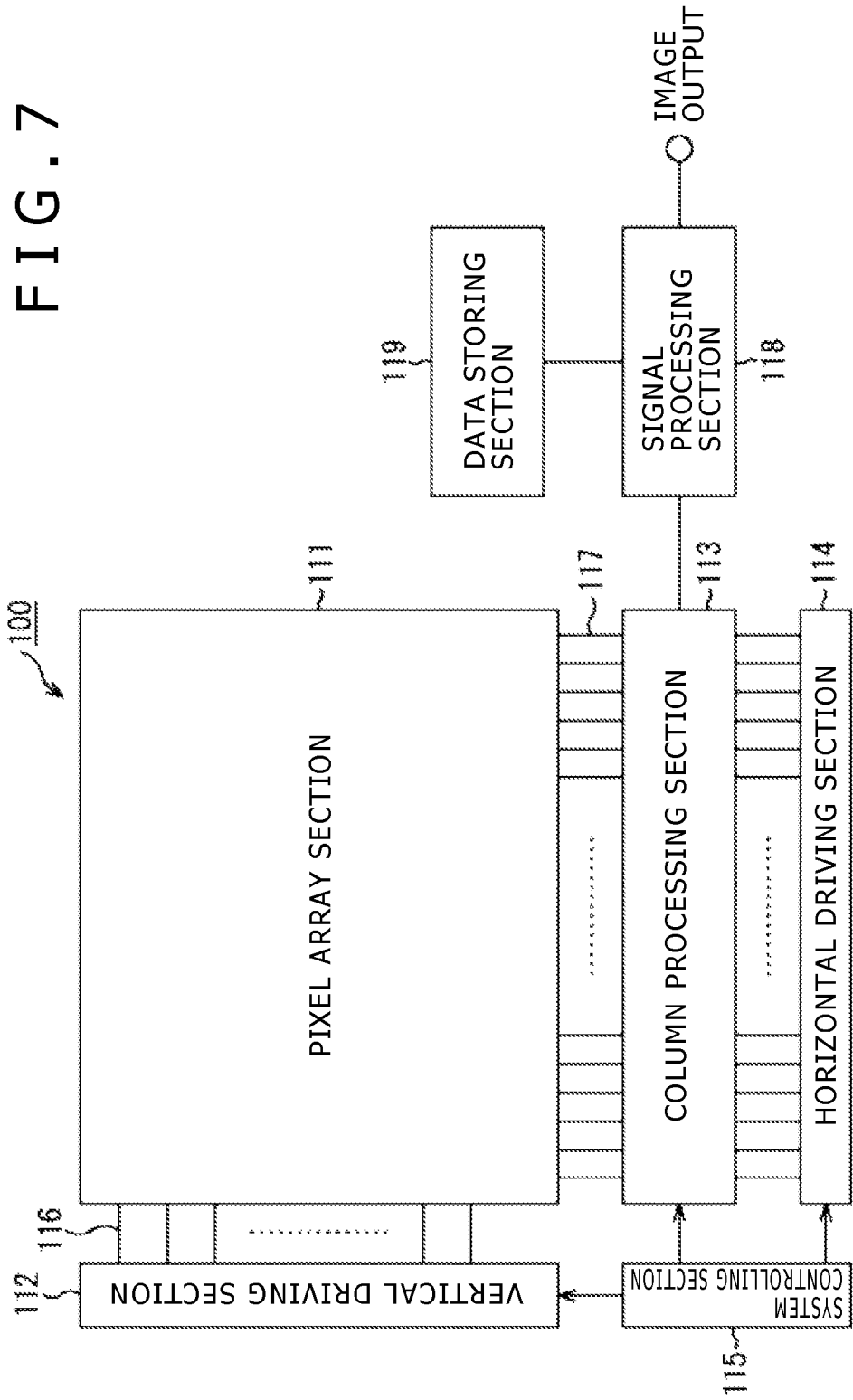
FIG. 7 is a block diagram showing an example of constitution of an embodiment of a solid-state image pickup device to which the present invention is applied.

FIG. 7 is a block diagram showing an example of constitution of a CMOS image sensor as a solid-state image pickup device to which the present invention is applied.

The CMOS image sensor 100 includes a pixel array section 111, a vertical driving section 112, a column processing section 113, a horizontal driving section 114, and a system controlling section 115. The pixel array section 111, the vertical driving section 112, the column processing section 113, the horizontal driving section 114, and the system controlling section 115 are formed on a semiconductor substrate (chip) not shown in FIG. 7.

In the pixel array section 111, unit pixels (unit pixels 211A in FIG. 8) having a photoelectric conversion element for generating a light charge whose amount corresponds to an amount of incident light and accumulating the light charge within the photoelectric conversion element are two-dimensionally arranged in the form of a matrix. Incidentally, the unit pixels may hereinafter be referred to simply as "pixels."

The pixel array section 111 further has a pixel driving line 116 formed for each row of the pixel arrangement in the form of a matrix along a horizontal direction of FIG. 7 (direction of arrangement of pixels of pixel rows) and a vertical signal line 117 formed for each column of the pixel arrangement in the form of a matrix along a vertical direction of FIG. 7 (direction of arrangement of pixels of pixel columns). While FIG. 7 shows one pixel driving line 116 for each row, the pixel driving line 116 is not limited to one line for each row. One terminal of the pixel driving lines 116 is connected to output terminals corresponding to the respective rows of the vertical driving section 112.

The CMOS image sensor 100 further includes a signal processing section 118 and a data storing section 119. The signal processing section 118 and the data storing section 119 may be realized by an external signal processing section provided on a substrate separate from the CMOS image sensor 100, for example a DSP (Digital Signal Processor) or processing by software, or may be mounted on the same substrate as the CMOS image sensor 100.

The vertical driving section 112 is formed by a shift register, an address decoder or the like. The vertical driving section 112 is a pixel driving section for driving each pixel of the pixel array section 111 on an all-pixel simultaneous basis or in row units, for example. Though a concrete constitution of the vertical driving section 112 is not shown, the vertical driving section 112 generally has two scanning systems, that is, a readout scanning system and a sweep-out scanning system.

The readout scanning system sequentially selects and scans the unit pixels of the pixel array section 111 in row units to read out signals from the unit pixels. The sweep-out scanning system performs sweep-out scanning of a readout row to be subjected to readout scanning by the readout scanning system, the sweep-out scanning preceding the readout scanning by a time corresponding to a shutter speed.

The sweep-out scanning by the sweep-out scanning system sweeps out an unnecessary charge from the photoelectric conversion elements of the unit pixels in the readout row (resets the photoelectric conversion elements). Then, a so-called electronic shutter operation is performed by the sweeping out of the unnecessary charges (reset) by the sweep-out scanning system. The electronic shutter operation in this case refers to an operation of discarding the light charges of the photoelectric conversion elements and starting new light exposure (starting accumulating light charges).

A signal read out by a readout operation of the readout scanning system corresponds to an amount of light incident after an immediately preceding readout operation or the electronic shutter operation. A period from the readout timing of the immediately preceding readout operation or the sweep-out timing of the electronic shutter operation to the readout timing of the present readout operation is a time (exposure time) of accumulation of a light charge in unit pixels.

The pixel signal output from each unit pixel of a pixel row selected and scanned by the vertical driving section 112 is supplied to the column processing section 113 through each of the vertical signal lines 117. The column processing section 113 subjects the pixel signal output from each unit pixel of the selected row through the vertical signal line 117 to predetermined signal processing for each pixel column of the pixel array section 111, and temporarily retains the pixel signal after the signal processing.

Specifically, the column processing section 113 performs at least noise removal processing, for example CDS (Correlated Double Sampling) as the signal processing. The CDS processing of the column processing section 113 removes reset noise, fixed pattern noise unique to pixels such as variations in threshold value of amplifying transistors. The column processing section 113 can be provided with for example an AD (Analog-to-Digital) converting function in addition to the noise removal processing function to output a signal level as a digital signal.

The horizontal driving section 114 is formed by a shift register, an address decoder or the like. The horizontal driving section 114 selects unit circuits corresponding to the pixel columns of the column processing section 113 in order. The pixel signals resulting from the signal processing in the column processing section 113 are output to the signal processing section 118 in order by the selection and scanning of the horizontal driving section 114.

The system controlling section 115 is formed by a timing generator or the like for generating various timing signals. The system controlling section 115 performs driving control on the vertical driving section 112, the column processing section 113, and the horizontal driving section 114, for example, on the basis of the various timing signals generated by the timing generator.

The signal processing section 118 has at least an addition processing function. The signal processing section 118 subjects the pixel signals output from the column processing section 113 to various signal processing such as adding processing. The data storing section 119 temporarily stores data necessary for the signal processing in the signal processing section 118 at the time of the signal processing in the signal processing section 118.

[Constitution of Unit Pixels 211A]

A concrete constitution of the unit pixels 211A arranged in the form of a matrix in the pixel array section 111 in FIG. 7 will next be described with reference to FIGS. 8 to 11.

Figure 8:
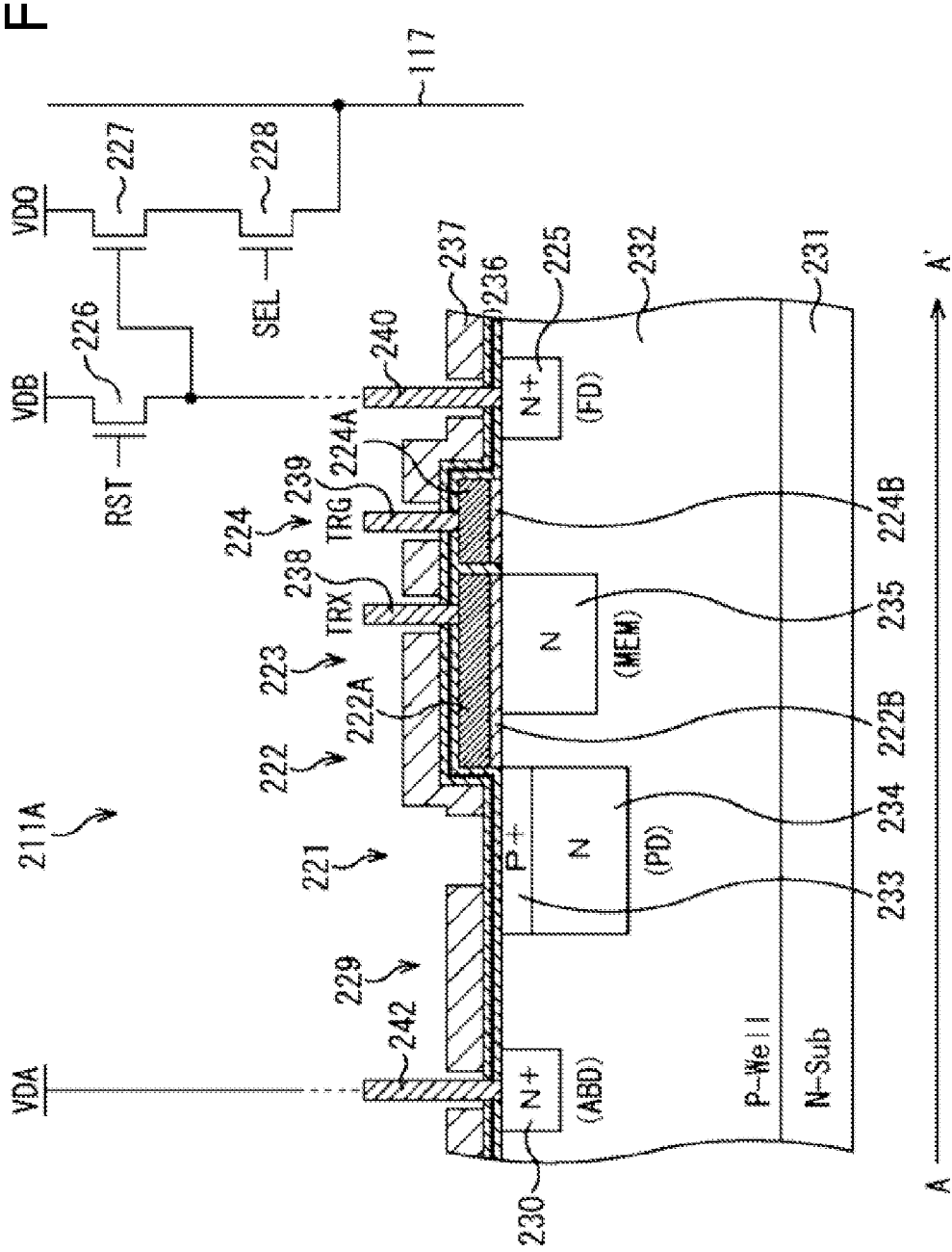
FIG. 8 is a sectional view of an example of constitution of a first embodiment of a unit pixel.
Figure 9:
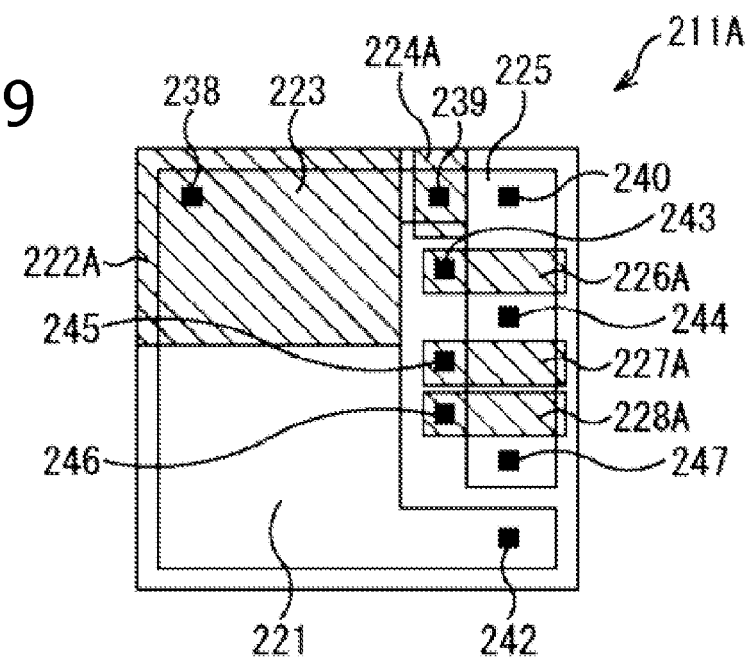
FIG. 9 is a plan view of the example of constitution of the first embodiment of the unit pixel.
Figure 10:
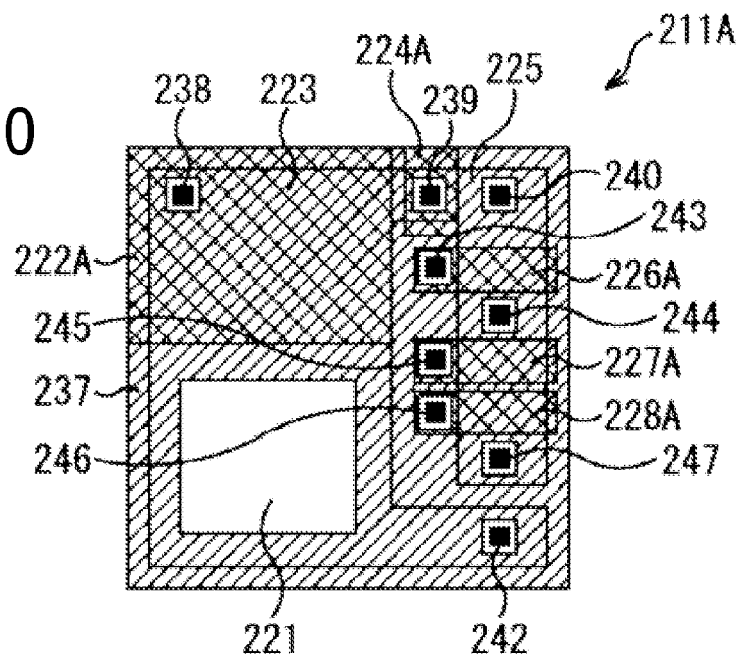
FIG. 10 is a plan view of the example of constitution of the first embodiment of the unit pixel.
Figure 11:
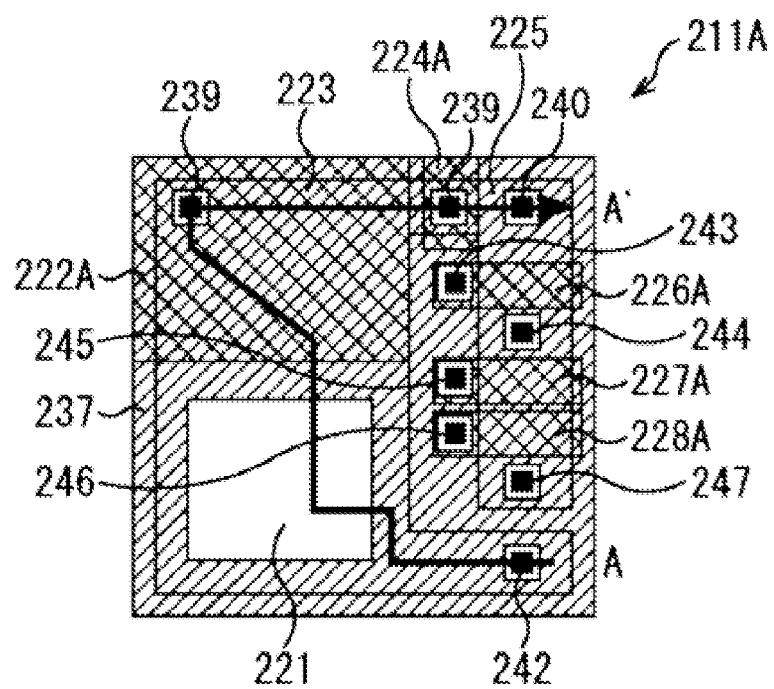
FIG. 11 is a plan view of the example of constitution of the first embodiment of the unit pixel.

FIG. 8 shows an example of a sectional constitution of a unit pixel 211A in a direction A-A' shown in FIG. 11. FIG. 9 and FIG. 10 are plan views showing an example of constitution of the unit pixel 211A. However, FIG. 9 shows the constitution excluding a light shielding film 237, and FIG. 10 shows the constitution including the light shielding film 237. Incidentally, FIG. 9 and FIG. 10 do not show an insulating film 236 to facilitate the understanding of the figures. FIG. 11 is a diagram made by adding a path A-A' to FIG. 10.

The unit pixel 211A has for example a photodiode (PD) 221 as a photoelectric conversion element. The photodiode 221 is for example a buried type photodiode formed by burying an N-type buried layer 234 in a P-type well layer 232 formed on an N-type substrate 231, with a P-type layer 233 formed on the side of a substrate surface. Incidentally, the P-type layer 233 and the N-type buried layer 234 have such an impurity concentration as to be in a depleted state at a time of a charge discharge.

In addition to the photodiode 221, the unit pixel 211A has a first transfer gate (TRX) 222, a memory part (MEM) 223, a second transfer gate (TRG) 224, and a floating diffusion region (FD) 225.

The first transfer gate 222 includes a gate electrode 222A formed of polysilicon and an insulating film 222B. The gate electrode 222A is formed so as to cover a part between the photodiode 221 and the memory part 223 and an upper part of the memory part 223 with the insulating film 222B interposed between the gate electrode 222A and the covered parts. A contact 238 for wiring is connected to an upper part on the memory part 223 side of the gate electrode 222A. The first transfer gate 222 transfers a charge accumulated in the photodiode 221 when a transfer pulse TRX is applied to the gate electrode 222A via the contact 238.

Incidentally, a state in which the transfer pulse TRX is applied to the gate electrode 222A will hereinafter be referred to also as a state in which the transfer pulse TRX is on or a state in which the first transfer gate 222 is on. In addition, a state in which the transfer pulse TRX is not applied to the gate electrode 222A will hereinafter be referred to also as a state in which the transfer pulse TRX is off or a state in which the first transfer gate 222 is off.

The memory part 223 is formed by an N-type buried channel 235 having such an impurity concentration as to be in a depleted state at a time of a charge discharge, the N-type buried channel 235 being formed under the gate electrode 222A. The memory part 223 accumulates the charge transferred from the photodiode 221 by the first transfer gate 222. Incidentally, because the memory part 223 is formed by the buried channel 235, it is possible to suppress the occurrence of a dark current at a Si—SiO$_2$ interface, and thereby contribute to an improvement in image quality.

In addition, modulation can be applied to the memory part 223 by disposing the gate electrode 222A in the upper part of the memory part 223 and applying the transfer pulse TRX to the gate electrode 222A. That is, the potential of the memory part 223 is deepened by applying the transfer pulse TRX to the gate electrode 222A. Thereby, an amount of saturation charge of the memory part 223 can be increased as compared with a case where the modulation is not applied.

The second transfer gate 224 includes a gate electrode 224A formed of polysilicon and an insulating film 224B. The gate electrode 224A is formed in an upper part between the memory part 223 and the floating diffusion region 225 with the insulating film 224B interposed between the gate electrode 224A and the P-type well layer 232. A contact 239 for wiring is connected to an upper part of the gate electrode 224A. The second transfer gate 224 transfers the charge accumulated in the memory part 223 when a transfer pulse TRG is applied to the gate electrode 224A via the contact 239.

Incidentally, a state in which the transfer pulse TRG is applied to the gate electrode 224A will hereinafter be referred to also as a state in which the transfer pulse TRG is on or a state in which the second transfer gate 224 is on. In addition, a state in which the transfer pulse TRG is not applied to the gate electrode 224A will hereinafter be referred to also as a state in which the transfer pulse TRG is off or a state in which the second transfer gate 224 is off.

The floating diffusion region 225 is a charge-to-voltage converting part formed of an N-type layer having an impurity concentration such that a contact 240 for wiring can be electrically connected to the floating diffusion region 225. The floating diffusion region 225 converts the charge transferred from the memory part 223 by the second transfer gate 224 into a voltage. The contact 240 for wiring is connected to an upper part of the floating diffusion region 225.

The unit pixel 211A further includes a reset transistor 226, an amplifying transistor 227, and a selecting transistor 228. Incidentally, FIG. 8 shows an example in which an N-channel MOS transistor is used as the reset transistor 226, the amplifying transistor 227, and the selecting transistor 228. However, a combination of conduction types of the reset transistor 226, the amplifying transistor 227, and the selecting transistor 228 is not limited to the combination of these conduction types.

The drain electrode of the reset transistor 226 is connected to a power supply VDB via a contact 244 (FIG. 9). The source electrode of the reset transistor 226 is connected to the floating diffusion region 225. In addition, the gate electrode 226A (FIG. 9) of the reset transistor 226 is connected with a contact 243 for wiring. By applying a reset pulse RST to the gate electrode 226A via the contact 243 and thus turning on the reset transistor 226, the floating diffusion region 225 is reset, and a charge is discharged from the floating diffusion region 225.

The drain electrode of the amplifying transistor 227 is connected to a power supply VDO via a contact 244 (FIG. 9). The gate electrode 227A (FIG. 9) of the amplifying transistor 227 is connected to the floating diffusion region 225 via a contact 245 (FIG. 9). The drain electrode of the selecting transistor 228 is connected to the source electrode of the amplifying transistor 227. The source electrode of the selecting transistor 228 is connected to a vertical signal line 117 via a contact 247 (FIG. 9). In addition, the gate electrode 228A (FIG. 9) of the selecting transistor 228 is connected with a contact 246. By applying a selection pulse SEL to the gate electrode of the selecting transistor 228 via the contact 246 and thus turning on the selecting transistor 228, the unit pixel 211A as an object from which to read out a pixel signal is selected. That is, when the selecting transistor 228 is on, the amplifying transistor 227 supplies the pixel signal indicating the voltage of the floating diffusion region 225 to the column processing section 113 via the selecting transistor 228, the contact 247, and the vertical signal line 117.

Incidentally, the selecting transistor 228 can also be connected between the power supply VDO and the drain electrode of the amplifying transistor 227. It is also possible to omit one or a plurality of the reset transistor 226, the amplifying transistor 227, and the selecting transistor 228 according to a method of reading out the pixel signal, or share one or a plurality of the reset transistor 226, the amplifying transistor 227, and the selecting transistor 228 between a plurality of pixels.

The unit pixel 211A further includes a charge discharging gate (ABG) 229 and a charge discharging part (ABD) 230.

Figure 1:
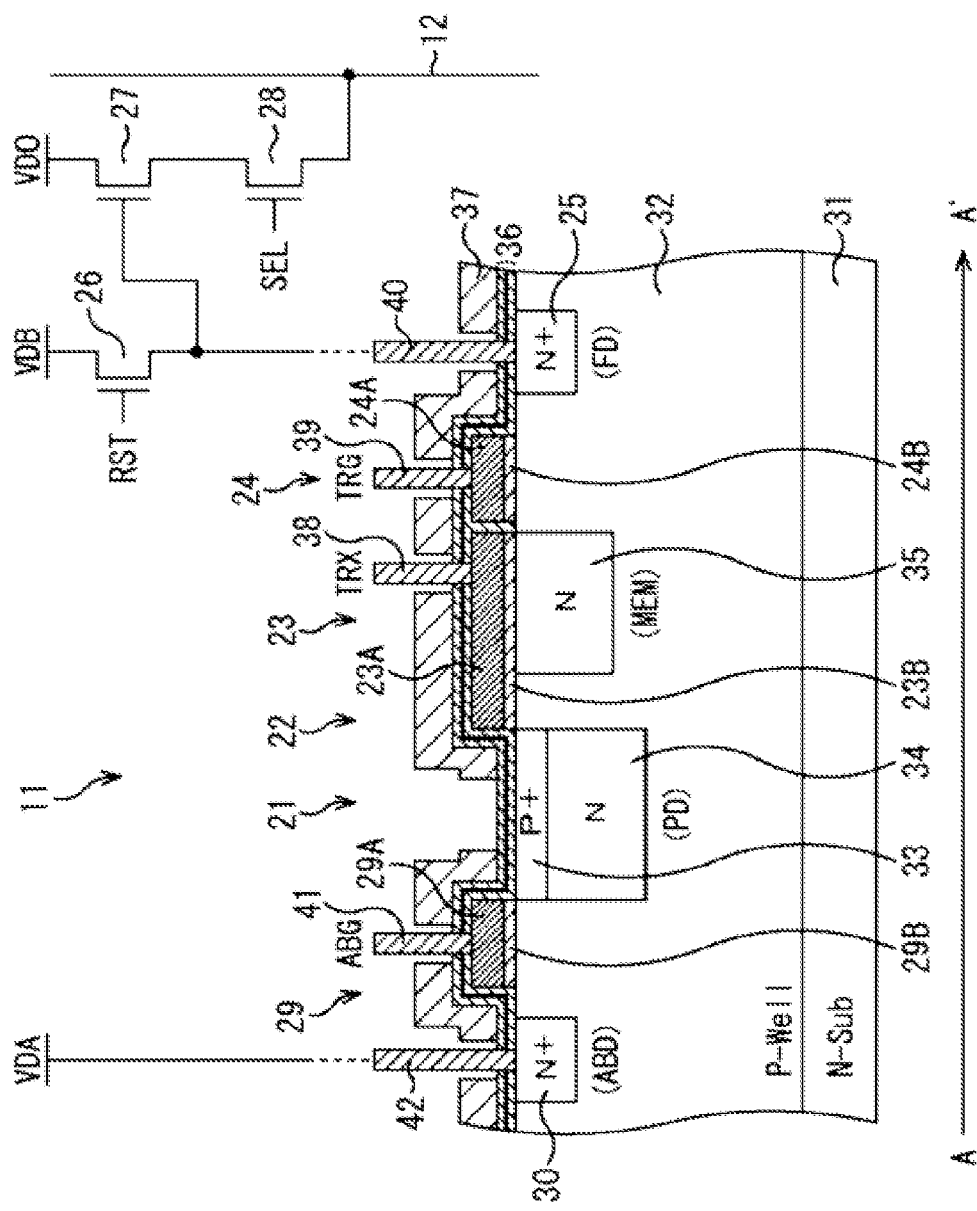
FIG. 1 is a sectional view of an example of constitution of a related-art unit pixel.
Figure 2:
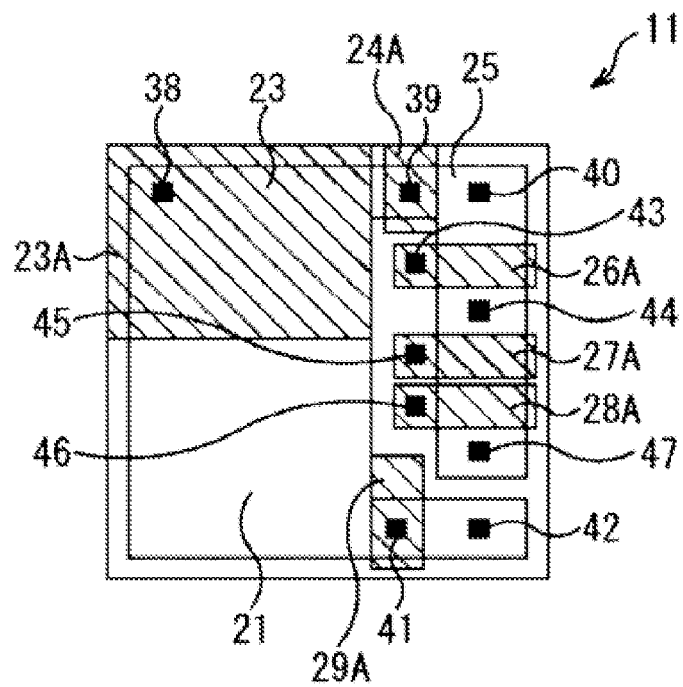
FIG. 2 is a plan view of the example of constitution of the related-art unit pixel.
Figure 3:
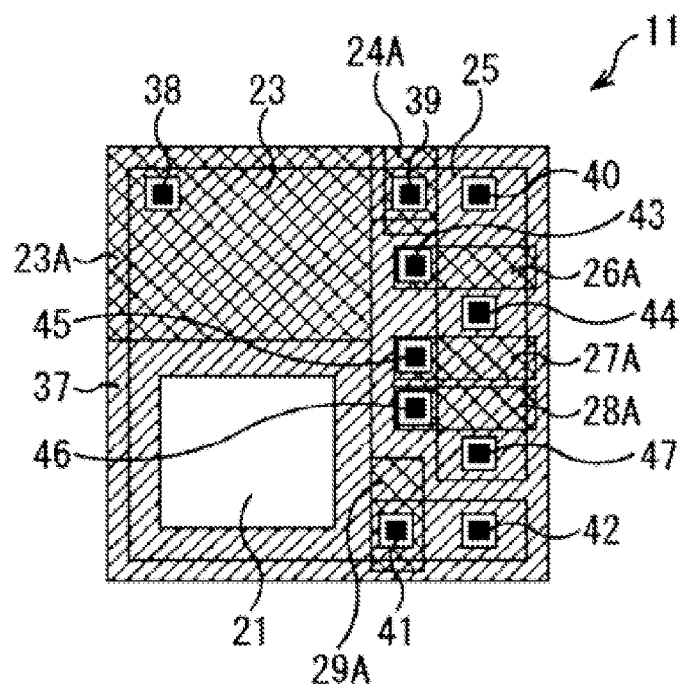
FIG. 3 is a plan view of the example of constitution of the related-art unit pixel.
Figure 4:
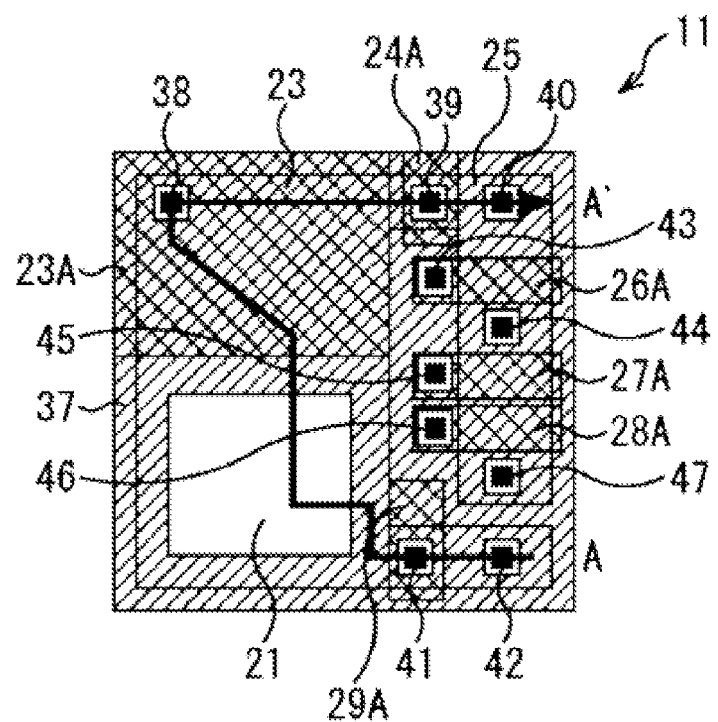
FIG. 4 is a plan view of the example of constitution of the related-art unit pixel.

Unlike the charge discharging gate 29 in FIG. 1, the charge discharging gate 229 does not have a gate electrode. When a predetermined control pulse ABG is applied to the light shielding film 237 instead, the charge discharging gate 229 transfers the charge accumulated in the photodiode 221. That is, in the charge discharging gate 229, the light shielding film 237 performs the function of the gate electrode. Specifically, when the control pulse ABG of a positive voltage is applied to the light shielding film 237, the potential of a potential barrier between the photodiode 221 and the charge discharging part 230 is heightened, and the height of the potential barrier is lowered. Thereby, an overflow path is formed between the photodiode 221 and the charge discharging part 230, and the charge accumulated in the photodiode 221 is transferred to the charge discharging part 230.

In this case, the other gates such as the first transfer gate 222 and the second transfer gate 224 have respective dedicated gate electrodes, and the light shielding film 237 is disposed on the upper side of each gate electrode. Thus, the application of the control pulse ABG to the light shielding film 237 does not affect the operation of the other gates.

In addition, because the charge discharging gate 229 does not have a gate electrode, no contact for wiring of the gate electrode is provided either.

Incidentally, a state in which the control pulse ABG is applied to the light shielding film 237 will hereinafter be referred to also as a state in which the control pulse ABG is on or a state in which the charge discharging gate 229 is on. In addition, a state in which the control pulse ABG is not applied to the light shielding film 237 will hereinafter be referred to also as a state in which the control pulse ABG is off or a state in which the charge discharging gate 229 is off.

The charge discharging part 230 is formed by an N-type layer having an impurity concentration such that a contact 242 for wiring can be electrically connected to the charge discharging part 230. The charge discharging part 230 is connected to a power supply VDA via the contact 242. The potential of the charge discharging part 230 is therefore substantially equal to the potential of the power supply VDA. The charge transferred from the photodiode 221 to the charge discharging part 230 by the charge discharging gate 229 is discharged to the power supply VDA. The charge discharging gate 229 and the charge discharging part 230 act to prevent an overflow of charge when the photodiode 221 saturates during a readout period after an end of light exposure.

An insulating film 236 having a three-layer structure of an oxide film, a nitride film, and an oxide film is formed in an upper surface of the unit pixel 211A. The insulating film 236 also functions as an optical reflection preventing film. The insulating film 236 has openings only in parts where the contacts 238 to 247 are formed. Incidentally, each of the layers forming the insulating film 236 is set at an optimum film thickness in consideration of a breakdown voltage and optical sensitivity characteristics.

Further, a light shielding film 237 made of a metal such as tungsten or the like is formed on an upper surface of the insulating film 236. As shown in FIG. 10, the light shielding film 237 has openings only in parts where a light receiving part of the photodiode 221 and the contacts 238 to 247 are formed.

The opening part of the light shielding film 237 for the light receiving part of the photodiode 221 is set at an optimum size and an optimum position according to a tradeoff between the optical sensitivity of the photodiode 221 and noise occurring in the memory part 223. Incidentally, the noise occurring in the memory part 223 in this case is noise occurring on the same principles as the smear of a CCD image sensor. For example, the noise is caused when light from an opening of the light shielding film 237 enters the memory part 223 or the vicinity of the memory part 223 and a charge thereby occurs within the memory part 223, or when a charge generated on the outside is spread and flows into the memory part 223.

In addition, the opening parts of the light shielding film 237 for the contacts 238 to 247 are a size larger than the sections of the respective contacts, and a predetermined space is secured between the light shielding film 237 and the contacts, in order to prevent a short circuit between each contact and the light shielding film 237. However, a short circuit tends to occur when the space between each contact and the light shielding film 237 is too narrow. When the space between each contact and the light shielding film 237 is too wide, stray light enters from the opening part, and the stray light increases the noise occurring on the same principles as the above-described smear. Thus, the opening parts for the respective contacts are also set at an optimum size according to a tradeoff between the two characteristics.

[Example of Constitution of Driving Signal Lines for Unit Pixels 211A]

Figure 12:
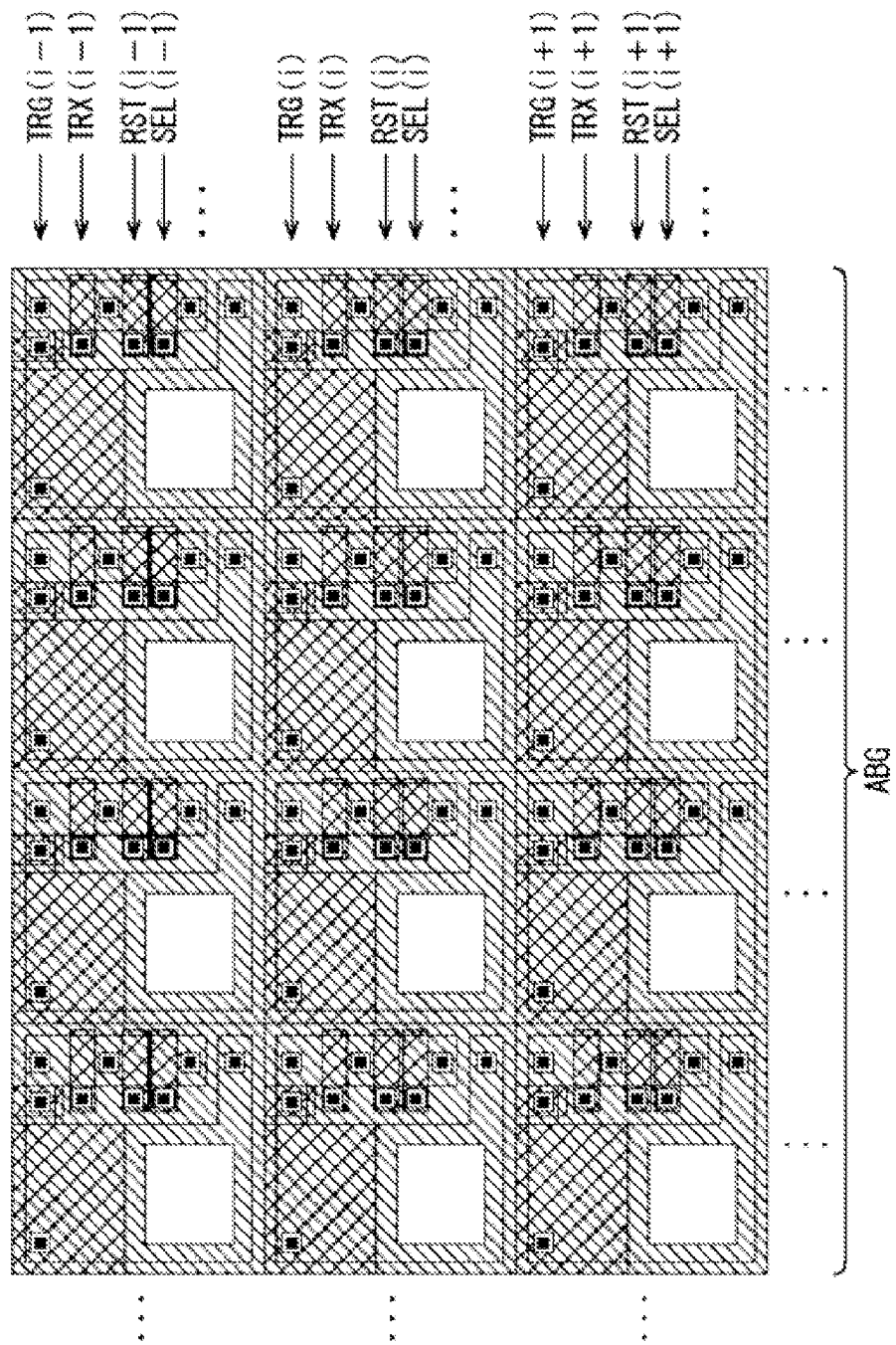
FIG. 12 is a diagram of assistance in explaining an example of constitution of driving signal lines for the first embodiment of the unit pixel.

FIG. 12 is a schematic diagram showing an arrangement of the unit pixels 211A in the pixel array section 111. Incidentally, in FIG. 12, description of the reference of each part is omitted to facilitate understanding of the figure.

In the pixel array section 111, the unit pixels 211A are arranged two-dimensionally in a vertical direction (column direction) and a horizontal direction (row direction). In addition, though not shown in FIG. 12, four driving signal lines are provided for each row, the four driving signal lines being a driving signal line TRG for the gate electrode 222A of the first transfer gate 222, a driving signal line TRX for the gate electrode 224A of the second transfer gate 224, a driving signal line RST for the gate electrode 226A of the reset transistor 226, and a driving signal line SEL for the gate electrode 228A of the selecting transistor 228.

Figure 5:
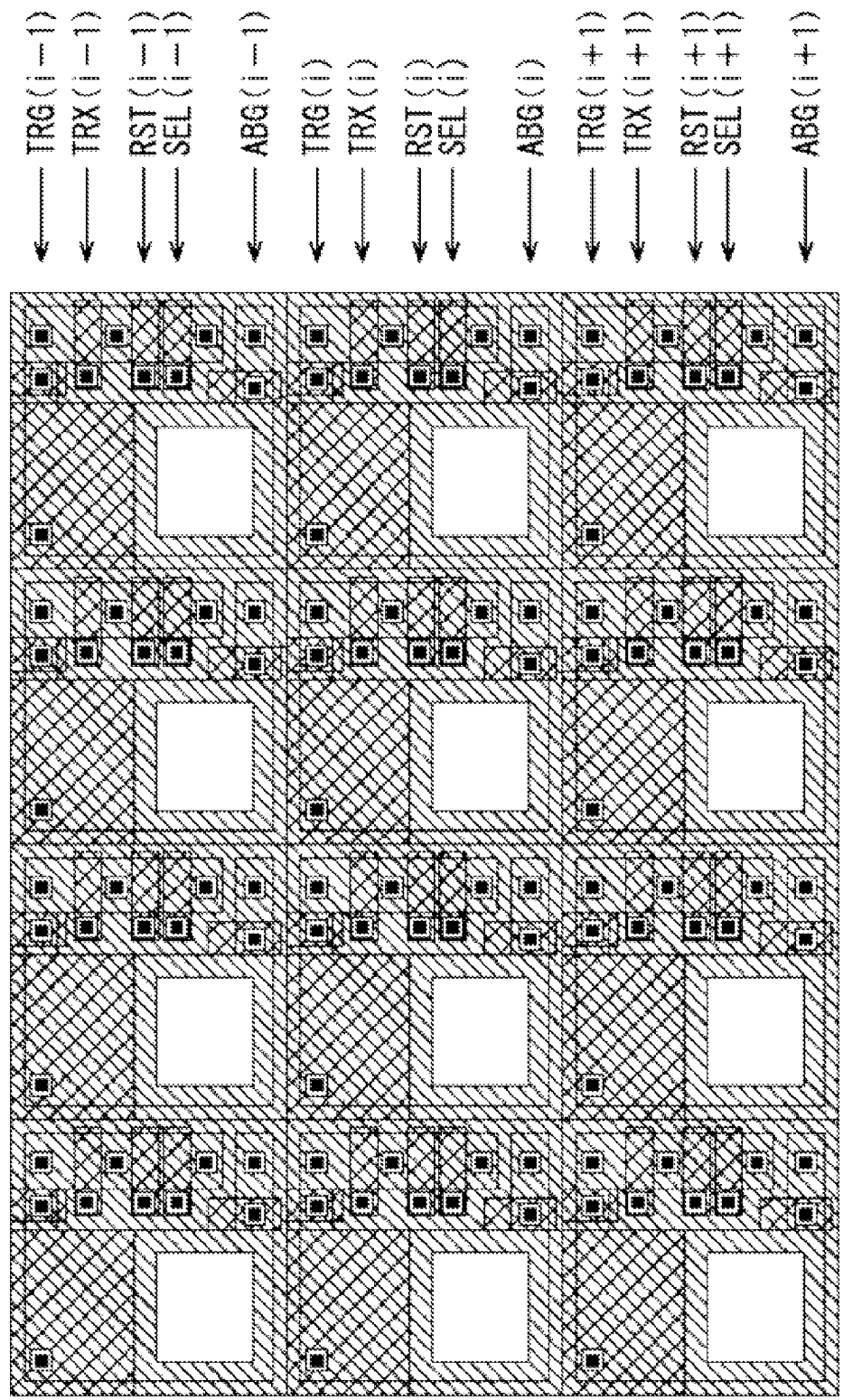
FIG. 5 is a diagram of assistance in explaining an example of constitution of driving signal lines for the related-art unit pixel.
Figure 6:
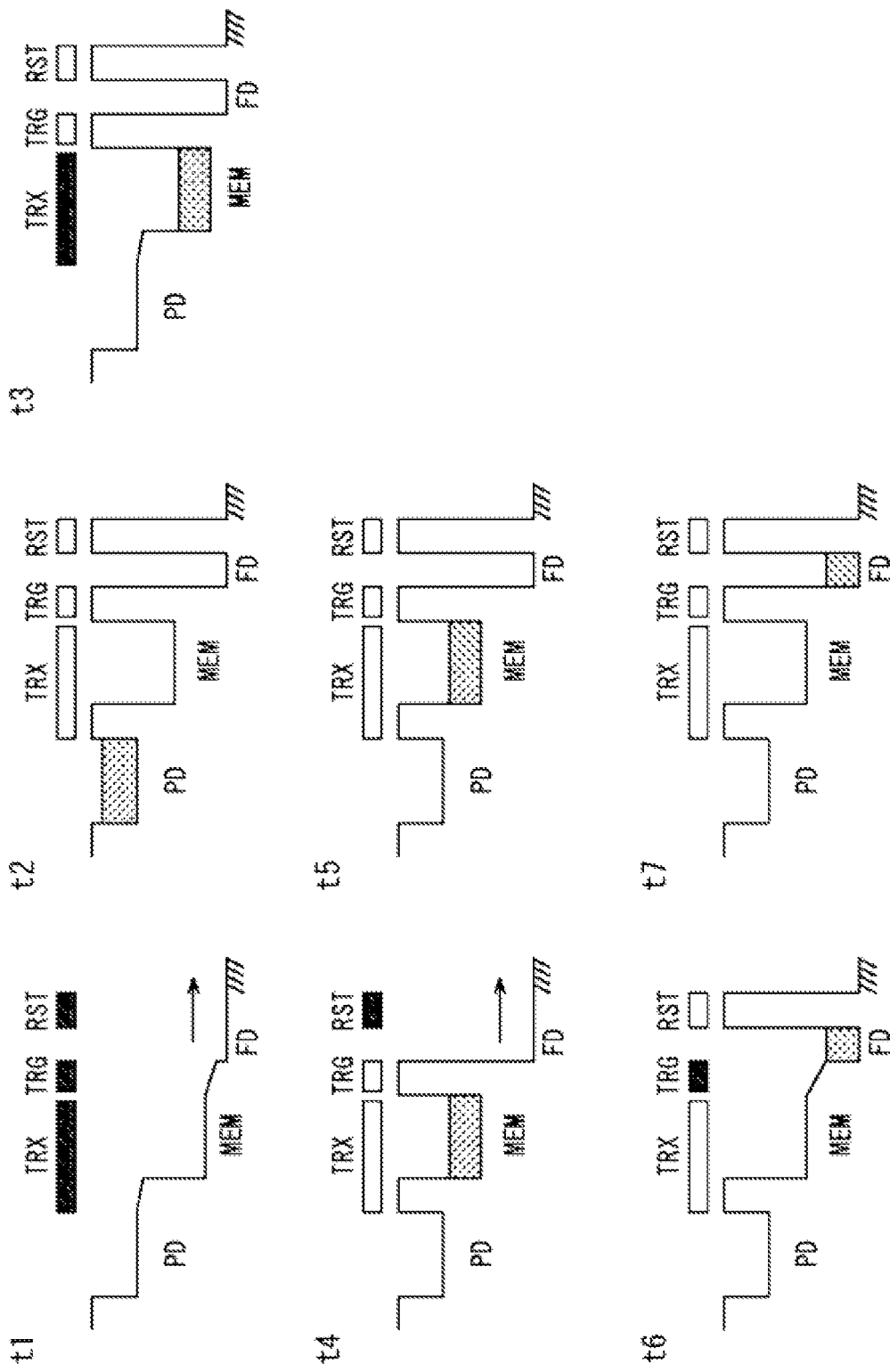
FIG. 6 is a potential diagram of assistance in explaining a driving method of the related-art unit pixel.

Thus, in the pixel array section 111 in which the unit pixels 211A are arranged, the driving signal line ABG for the gate electrode of the charge discharging gate can be omitted as compared with the pixel array section in which the unit pixels 11 are arranged in FIG. 5. A degree of freedom of layout of wiring for the driving signal lines is thereby improved. In addition, an opening area for the light receiving part of the photodiode 221 can be increased, the overall light receiving sensitivity of each pixel is improved, and in particular, the light receiving sensitivity of pixels in the vicinity of an end part of an angle of view where an angle of incidence of incident light is increased is improved. In addition, the shading of the incident light by the driving signal lines is decreased, so that the light receiving sensitivity is further improved.

Further, the need to provide an opening of the light shielding film 237 for the contact for the gate electrode of the charge discharging gate is eliminated, so that the light shielding characteristic of the light shielding film 237 is improved. Thereby, an amount of incidence of stray light incident from the openings of the light shielding film 237 is decreased, noise caused by the stray light is decreased, and an S/N ratio is improved.

Incidentally, the light shielding film 237 is for example connected to wiring extending from the vertical driving section 112 in a peripheral part on the outside of the pixel array section 111. That is, the light shielding film 237 and the vertical driving section 112 are connected to each other on the outside of the pixel array section 111. The control pulse ABG for driving the charge discharging gate 229 is applied from the vertical driving section 112 to the light shielding film 237 via the wiring. That is, the vertical driving section 112 controls the control pulse ABG applied to the light shielding film 237, whereby the transfer of a charge from the photodiode 221 to the charge discharging part 230 by the charge discharging gate 229 is controlled. Incidentally, the control pulse ABG may be controlled by another part than the vertical driving section 112.

[Method of Driving Unit Pixels 211A]

Figure 13:
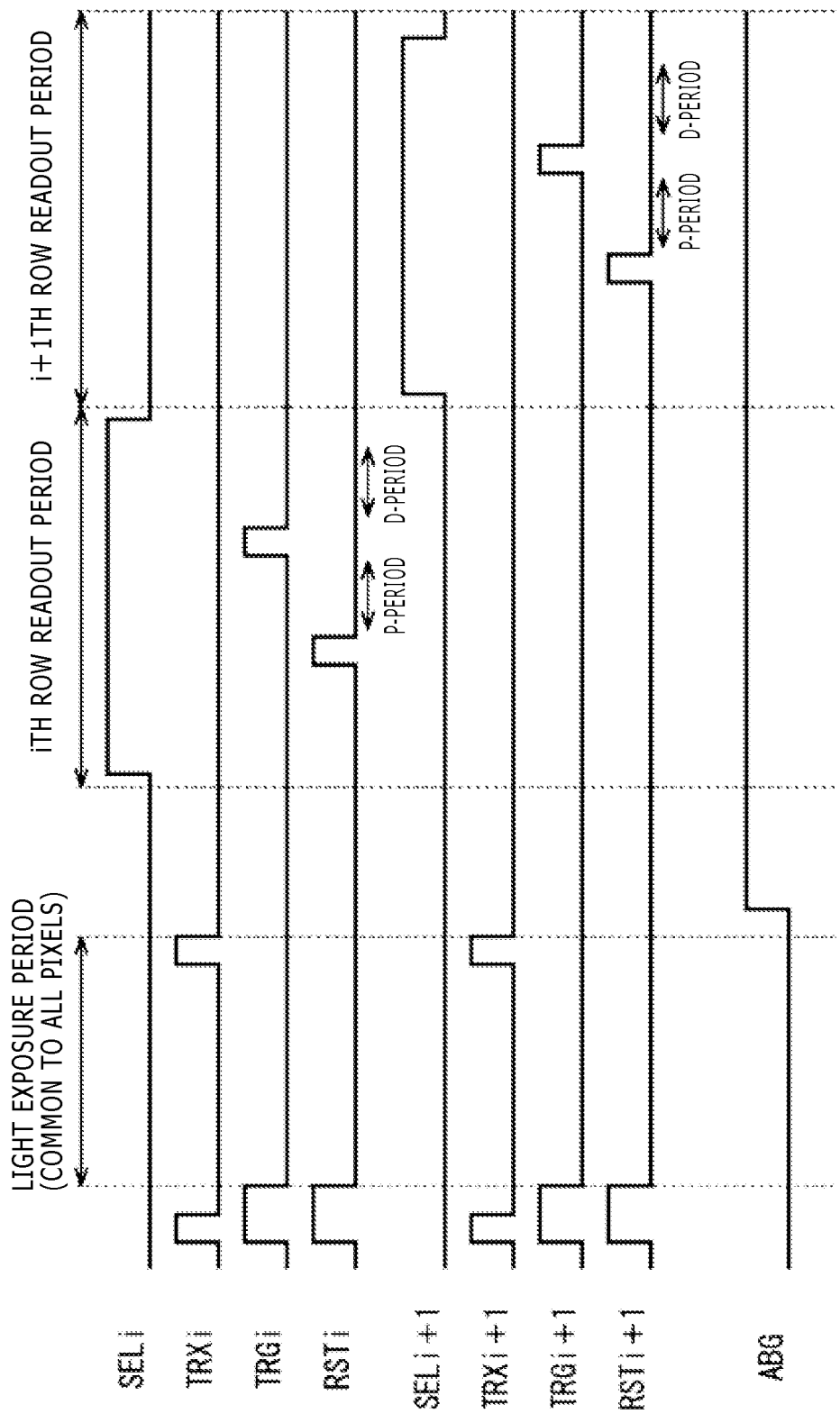
FIG. 13 is a timing chart of assistance in explaining a driving method of the first embodiment of the unit pixel.

A method of driving the unit pixels 211A in the CMOS image sensor 100 will next be described with reference to FIG. 13. Incidentally, FIG. 13 is a timing chart of a selection pulse SEL, a transfer pulse TRX, a transfer pulse TRG, a reset pulse RST, and a control pulse ABG for unit pixels 211A in an ith row and an (i+1)th row of the pixel array section 111 in a period of one frame.

First, the transfer pulse TRX, the transfer pulse TRG, and the reset pulse RST are turned on on an all-pixel simultaneous basis. Thereby, the first transfer gate 222 and the second transfer gate 224 are turned on, and the floating diffusion region 225 is reset. As a result, charges of the photodiode 221, the memory part 223, and the floating diffusion region 225 are discharged. Thereafter, the transfer pulse TRX is first turned off on an all-pixel simultaneous basis, so that the first transfer gate is turned off. Then, the transfer pulse TRG and the reset pulse RST are turned off, so that the second transfer gate 224 is turned off. At this point, light exposure is started on an all-pixel simultaneous basis, so that the accumulation of a charge in the photodiode 221 is started. That is, a period of accumulation of a signal charge is started.

Next, after the passage of a predetermined time, the transfer pulse TRX is turned on and thereby the first transfer gate 222 is turned on on an all-pixel simultaneous basis, so that a charge accumulated in the photodiode 221 is transferred to the memory part 223. Thereafter, the transfer pulse TRX is turned off on an all-pixel simultaneous basis, so that the first transfer gate 222 is turned off, and the light exposure is ended on an all-pixel simultaneous basis.

Next, the control pulse ABG is turned on, and thereby the charge discharging gate 229 is turned on on an all-pixel simultaneous basis, so that an overflow path from the photodiode 221 to the charge discharging part 230 is formed. Thereby, a charge generated in the photodiode 221 after the charge transfer from the photodiode 221 to the memory part 223 is discharged into the charge discharging part 230 via the charge discharging gate 229, and is thus prevented from flowing into the memory part 223.

At this point, the period of accumulation of the signal charge is ended, and a transition is made to a readout period for reading out a pixel signal based on the charge accumulated in each unit pixel 211A. Incidentally, pixel signal readout is performed pixel by pixel or in units of a plurality of pixels. Incidentally, an example of performing pixel signal readout row by row will be shown in the following.

For example, when the pixel signals of unit pixels 211A in an ith row are to be read out, the selection pulse SEL for selecting transistors 228 in the ith row is turned on, so that the unit pixels 211A in the ith row are set as objects from which to read out the pixel signals.

Then, the reset pulse RST is first turned on, so that the floating diffusion region 225 is reset. Thereafter the reset pulse RST is turned off. Then, a reset signal indicating a reset level is supplied from the amplifying transistor 227 to the column processing section 113 via the selecting transistor 228 and the vertical signal line 117. The column processing section 113 reads out the reset level on the basis of the reset signal. Incidentally, a period for reading out the reset level will hereinafter be referred to as a P-period.

Next, the transfer pulse TRG is turned on, and thereby the second transfer gate 224 is turned on, so that the charge accumulated in the memory part 223 is transferred to the floating diffusion region 225. Then, a charge detection signal indicating a signal level based on the charge transferred to the floating diffusion region 225 is supplied from the amplifying transistor 227 to the column processing section 113 via the selecting transistor 228 and the vertical signal line 117. The column processing section 113 reads out the signal level on the basis of the charge detection signal. Incidentally, a period for reading out the signal level will hereinafter be referred to as a D-period.

The column processing section 113 then performs CDS processing for obtaining a difference between the reset level read out in the P-period and the signal level read out in the D-period, and thereby removes noise from the detected signal level.

Thereafter, the selection pulse SEL is turned off, so that the readout period for the unit pixels 211A in the ith row is ended, and a transition is made to a readout period for the unit pixels 211A in the (i+1)th row. After the readout of signal levels in all rows is completed, a transition is made to the head of the timing chart of FIG. 13 to start an accumulation period for a next frame as required.

<2. Second Embodiment>

A second embodiment of the present invention will next be described with reference to FIG. 14. Incidentally, the second embodiment has a different unit pixel constitution from that of the first embodiment, while the constitution of a CMOS image sensor 100 is similar to that of the first embodiment. Repeated description of parts common to the first embodiment will be omitted in the following.

Figure 14:
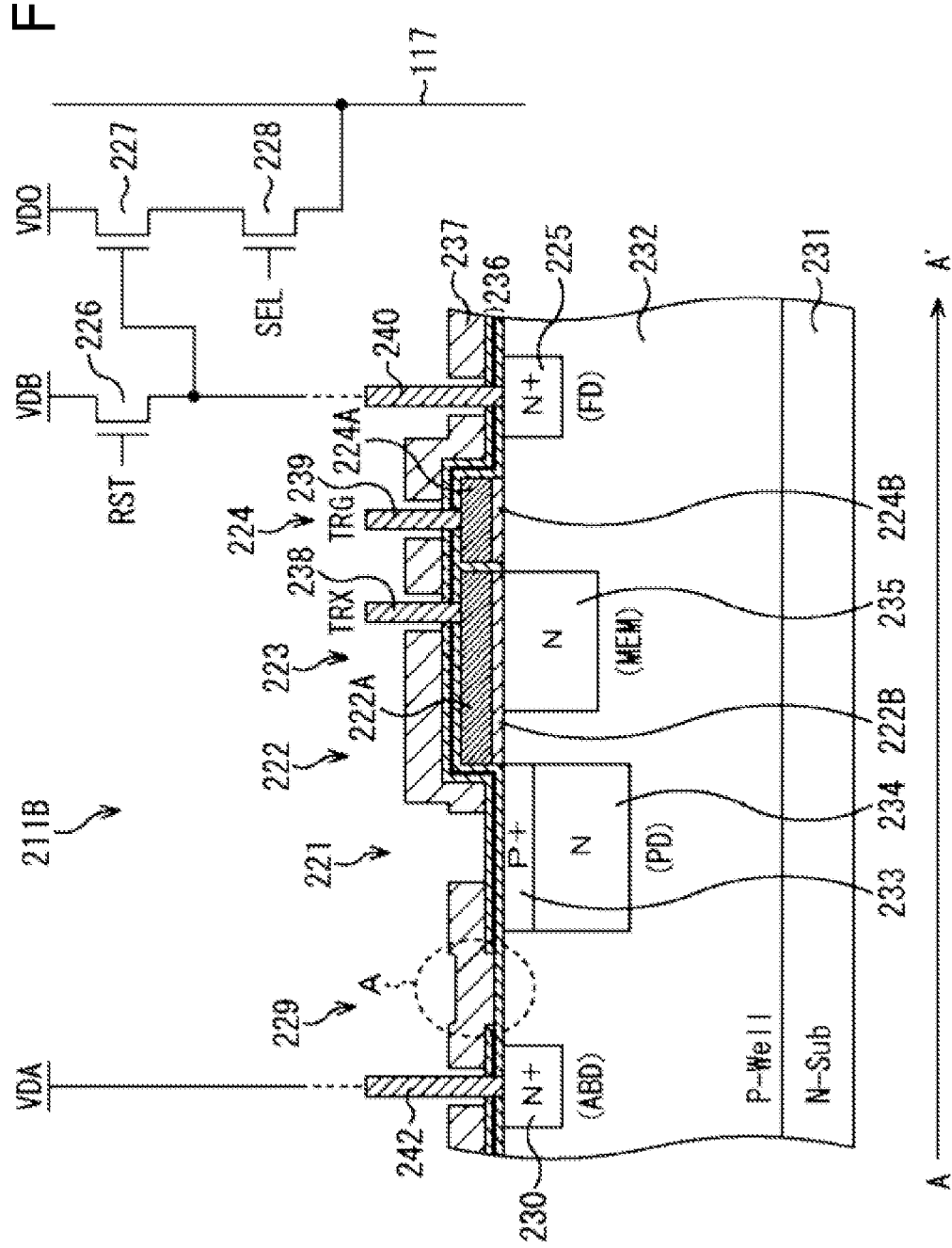
FIG. 14 is a sectional view of an example of constitution of a second embodiment of the unit pixel.

As with FIG. 8, FIG. 14 is a diagram showing an example of a sectional constitution of a unit pixel 211B. Incidentally, in FIG. 14, parts corresponding to those of FIG. 8 are identified by the same reference numerals.

A comparison between the unit pixel 211B and the unit pixel 211A indicates that the constitution of an insulating film 236 in a part enclosed by a dotted line A is different and that other parts are the same. Specifically, only the insulating film 236 between a part of a light shielding film 237 which part forms a charge discharging gate 229 between a photodiode 221 and a charge discharging part 230 and a semiconductor substrate (silicon substrate) does not have a nitride film having a high breakdown voltage in a second layer of the insulating film 236, and is formed by an oxide film alone. Thereby, when a control pulse ABG is applied to the light shielding film 237, modulation applied to the semiconductor substrate (silicon substrate) by the control pulse ABG is strengthened in only the part of the charge discharging gate 229 from which the nitride film is removed, so that the potential barrier of the charge discharging gate 229 is controlled easily.

In the case of forming this insulating film 236, for example, an oxide film in a first layer and the nitride film in the second layer are first formed, and then the part from which to remove the nitride film is covered with a resist. Next, the nitride film in the part covered with the resist is removed by etching. Incidentally, at this time, a part or all of the oxide film in the first layer in the part covered with the resist may be removed. Then, finally, an oxide film in a third layer is formed. Thus, the insulating film 236 one part of which is formed by an oxide film alone can be formed easily.

<3. Third Embodiment>

A third embodiment of the present invention will next be described with reference to FIGS. 15 to 20. Incidentally, the third embodiment has a different unit pixel constitution from that of the first embodiment, while the constitution of a CMOS image sensor 100 is similar to that of the first embodiment. Repeated description of parts common to the first embodiment will be omitted in the following.

[Example of Constitution of Unit Pixel 211C]

Figure 15:
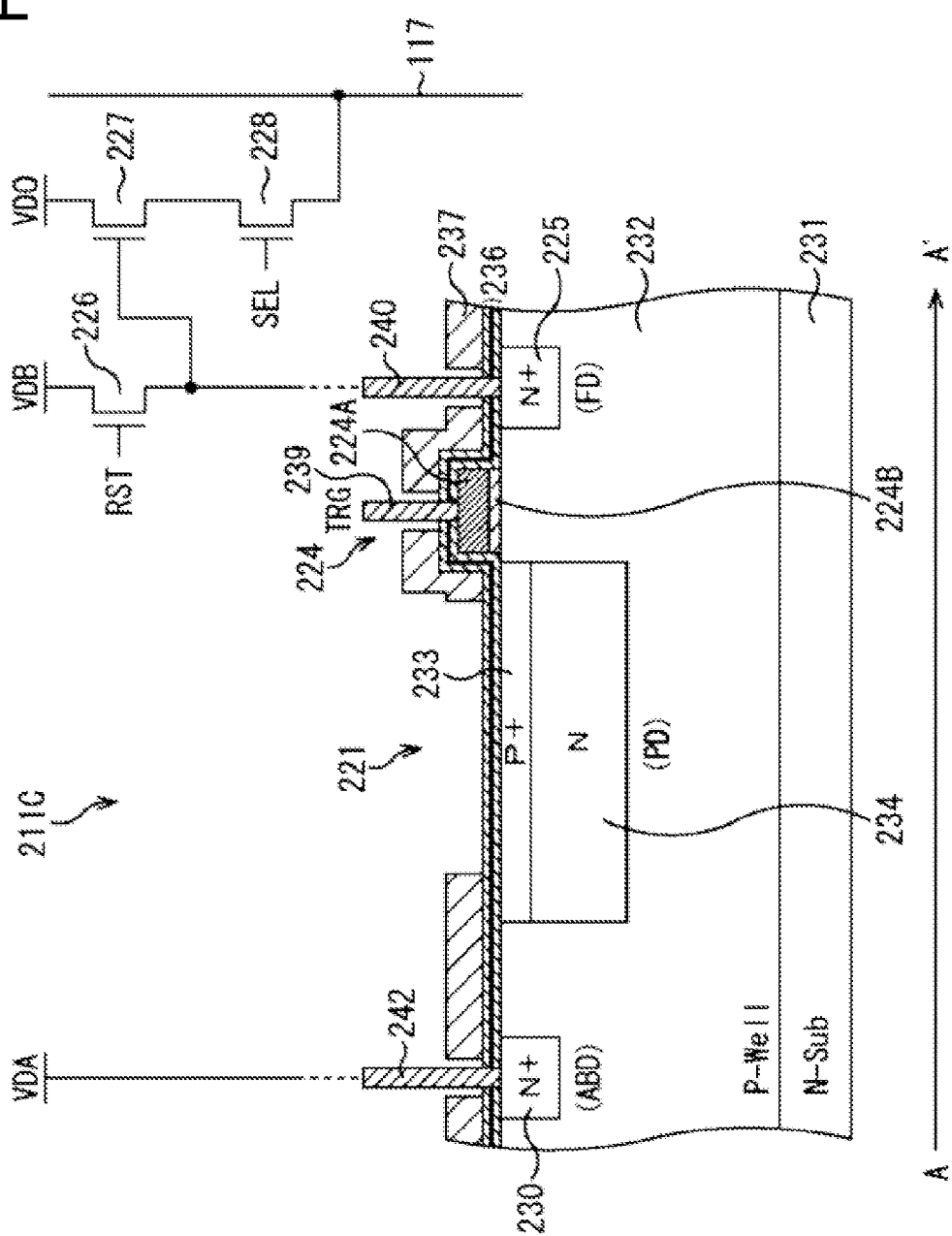
FIG. 15 is a sectional view of an example of constitution of a third embodiment of the unit pixel.
Figure 16:
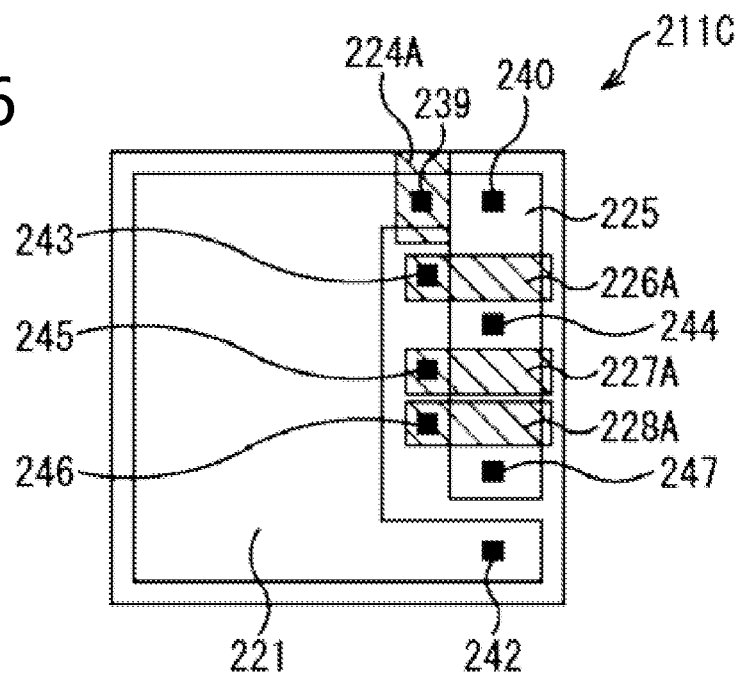
FIG. 16 is a plan view of the example of constitution of the third embodiment of the unit pixel.
Figure 17:
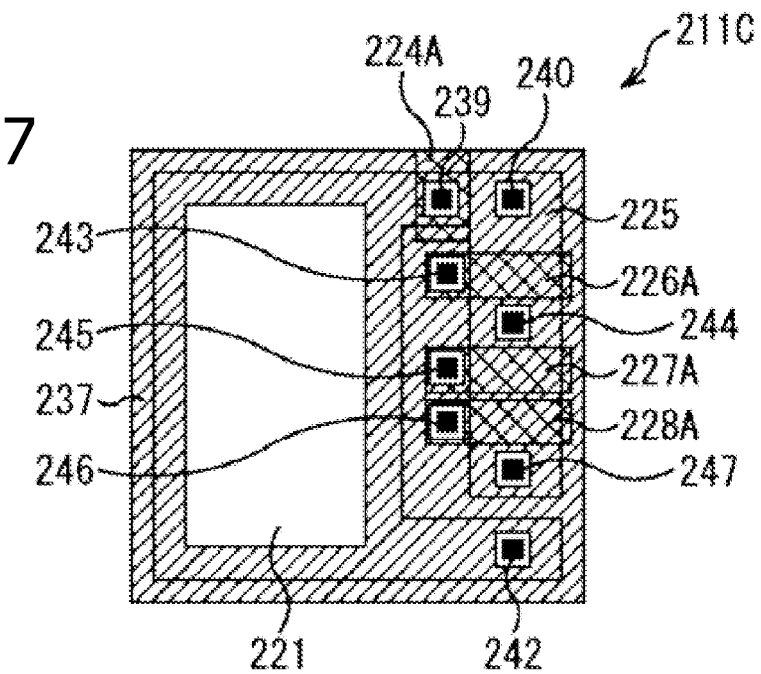
FIG. 17 is a plan view of the example of constitution of the third embodiment of the unit pixel.
Figure 18:
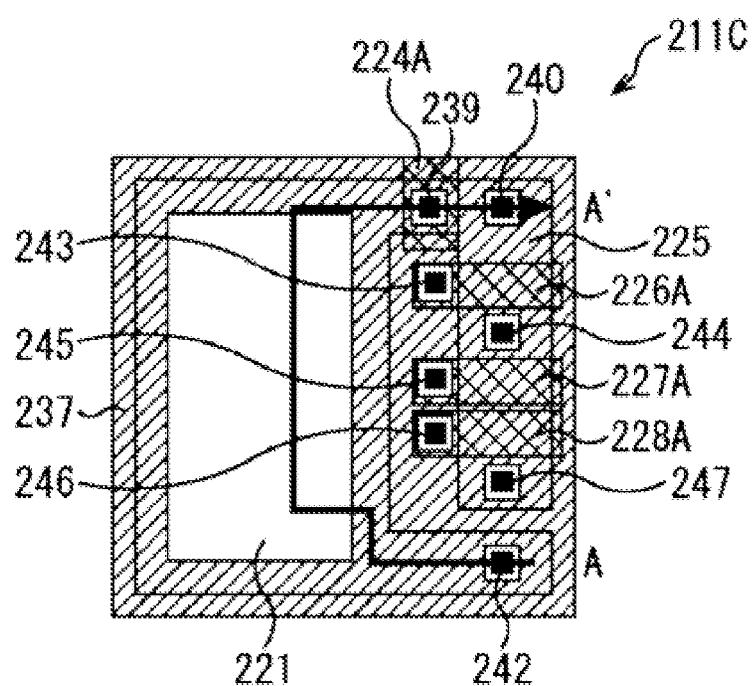
FIG. 18 is a plan view of the example of constitution of the third embodiment of the unit pixel.

FIG. 15 shows an example of a sectional constitution of a unit pixel 211C in a direction A-A' shown in FIG. 18. FIG. 16 and FIG. 17 are plan views showing an example of constitution of the unit pixel 211C. However, FIG. 16 shows the constitution excluding a light shielding film 237, and FIG. 17 shows the constitution including the light shielding film 237. Incidentally, FIG. 16 and FIG. 17 do not show an insulating film 236 to facilitate the understanding of the figures. FIG. 18 is a diagram made by adding a path A-A' to FIG. 17. Incidentally, in FIGS. 15 to 18, parts corresponding to those of FIGS. 8 to 11 are identified by the same reference numerals.

A comparison between the unit pixel 211C and the unit pixel 211A indicates that the unit pixel 211C and the unit pixel 211A are different from each other in that the unit pixel 211C does not have a first transfer gate 222, a memory part 223, and a contact 238, and that other parts are the same.

In the unit pixel 211C, a charge accumulated in a photodiode 221 is transferred to a floating diffusion region 225 via a second transfer gate 224, and is retained in the floating diffusion region 225. It is thereby possible to increase the area of a light receiving part of the photodiode 221, and thus improve light receiving sensitivity, as is clear from a comparison between FIG. 17 and FIG. 10. In addition, an amount of saturation charge of the photodiode 221 can be increased. Further, an effect of noise occurring as the same phenomenon as the above-described smear can be reduced.

[Example of Constitution of Driving Signal Lines for Unit Pixels 211C]

Figure 19:
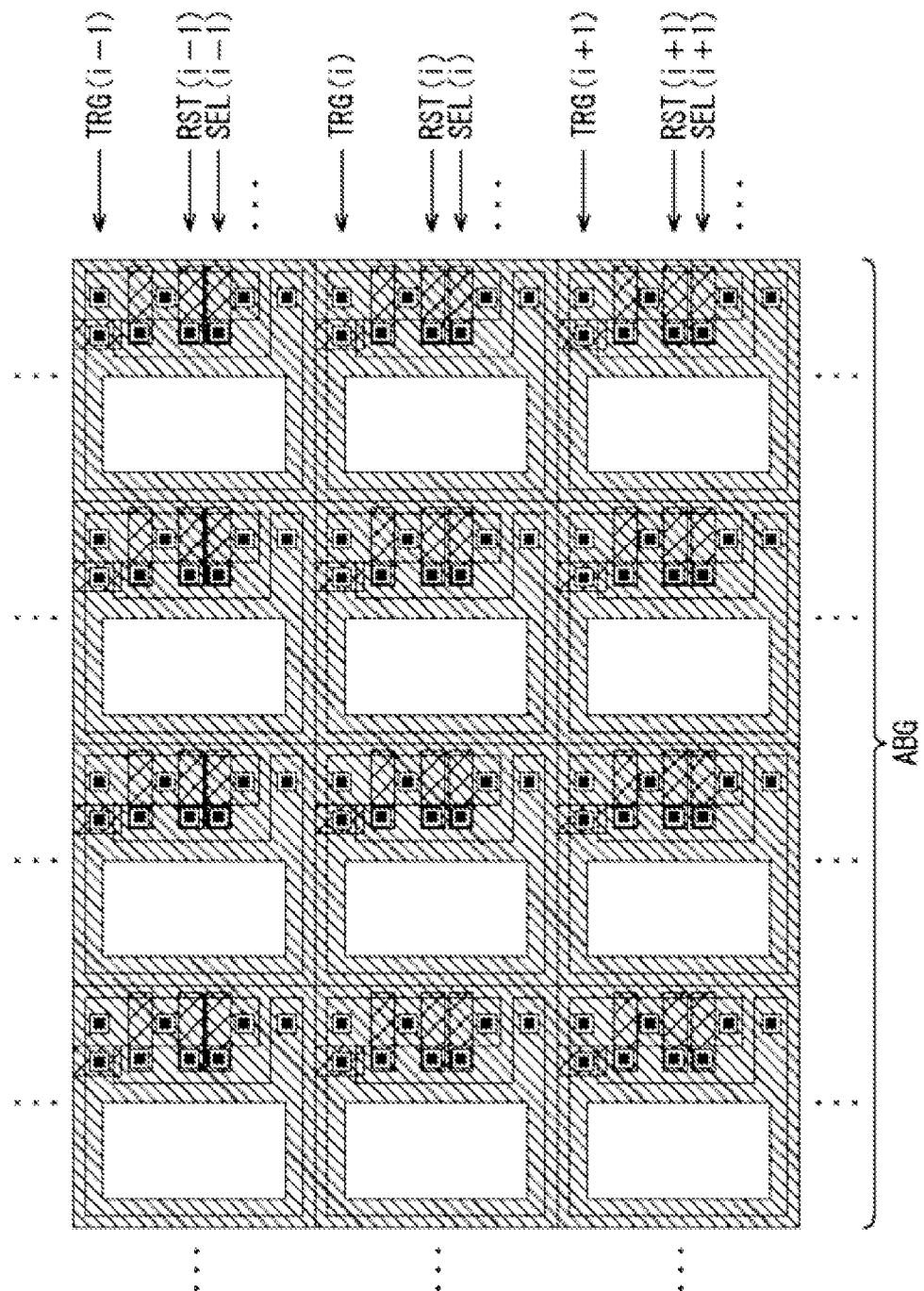
FIG. 19 is a diagram of assistance in explaining an example of constitution of driving signal lines for the third embodiment of the unit pixel.

FIG. 19 is a schematic diagram showing an arrangement of unit pixels 211C in a pixel array section 111. Incidentally, in FIG. 19, description of the reference of each part is omitted to facilitate understanding of the figure.

In the pixel array section 111, the unit pixels 211C are arranged two-dimensionally in a vertical direction (column direction) and a horizontal direction (row direction). In addition, though not shown in FIG. 19, three driving signal lines are provided for each row, the three driving signal lines being a driving signal line TRX for the gate electrode 224A of a second transfer gate 224, a driving signal line RST for the gate electrode 226A of a reset transistor 226, and a driving signal line SEL for the gate electrode 228A of a selecting transistor 228.

Thus, in the pixel array section 111 in which the unit pixels 211C are arranged, the driving signal line TRX for the gate electrode of the first transfer gate can be omitted as compared with the pixel array section 111 in which the unit pixels 211A are arranged in FIG. 12. A degree of freedom of layout of wiring for the driving signal lines is thereby further improved. In addition, an opening area for the light receiving part of the photodiode 221 can be further increased.

Further, the need to provide an opening of a light shielding film 237 for a contact for the gate electrode of the first transfer gate is eliminated, so that the light shielding characteristic of the light shielding film 237 is further improved. Thereby, further, an amount of incidence of stray light incident from the openings of the light shielding film 237 is decreased, noise caused by the stray light is decreased, and an S/N ratio is improved.

[Method of Driving Unit Pixels 211C]

Figure 20:
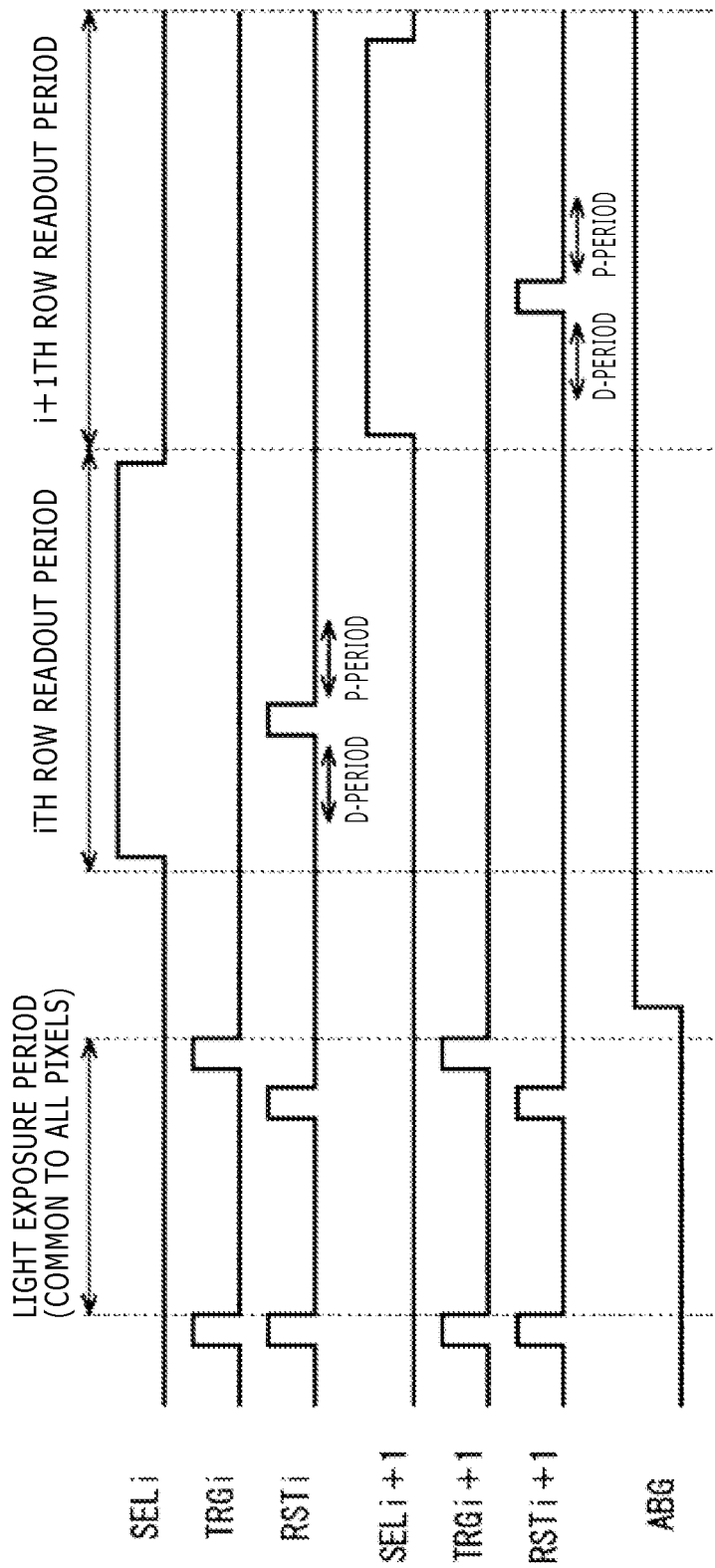
FIG. 20 is a timing chart of assistance in explaining a driving method of the third embodiment of the unit pixel.

A method of driving the unit pixels 211C in the CMOS image sensor 100 will next be described with reference to FIG. 20. Incidentally, FIG. 20 is a timing chart of a selection pulse SEL, a transfer pulse TRG, a reset pulse RST, and a control pulse ABG for unit pixels 211C in an ith row and an (i+1)th row of the pixel array section 111 in a period of one frame.

First, the transfer pulse TRG and the reset pulse RST are turned on on an all-pixel simultaneous basis. Thereby, the second transfer gate 224 is turned on, and the floating diffusion region 225 is reset. As a result, charges of the photodiode 221 and the floating diffusion region 225 are discharged. Thereafter, the transfer pulse TRG and the reset pulse RST are turned off, so that the second transfer gate 224 is turned off. At this point, light exposure is started on an all-pixel simultaneous basis, so that the accumulation of a charge in the photodiode 221 is started. That is, a period of accumulation of a signal charge is started.

Next, the reset pulse RST is turned on, and thereby the floating diffusion region 225 is reset, on an all-pixel simultaneous basis.

Next, after the passage of a predetermined time from the start of the signal charge accumulation period, the transfer pulse TRG is turned on and thereby the second transfer gate 224 is turned on, so that a charge accumulated in the photodiode 221 is transferred to the floating diffusion region 225. Thereafter, the transfer pulse TRG is turned off on an all-pixel simultaneous basis, so that the second transfer gate 224 is turned off, and the light exposure is ended on an all-pixel simultaneous basis.

Next, the control pulse ABG is turned on, and thereby a charge discharging gate 229 is turned on on an all-pixel simultaneous basis, so that an overflow path from the photodiode 221 to a charge discharging part 230 is formed.

At this point, the period of accumulation of the signal charge is ended, and a transition is made to a readout period for reading out a pixel signal based on the charge accumulated in each unit pixel 211C. Incidentally, pixel signal readout is performed pixel by pixel or in units of a plurality of pixels. Incidentally, an example of performing pixel signal readout row by row will be shown in the following.

For example, when the pixel signals of unit pixels 211C in an ith row are to be read out, the selection pulse SEL for selecting transistors 228 in the ith row is turned on, so that the unit pixels 211C in the ith row are selected as objects from which to read out the pixel signals.

Then, a charge detection signal indicating a signal level based on the charge transferred to the floating diffusion region 225 is supplied from an amplifying transistor 227 to a column processing section 113 via a selecting transistor 228 and a vertical signal line 117. The column processing section 113 reads out the signal level on the basis of the charge detection signal.

Next, the reset pulse RST is turned on, so that the floating diffusion region 225 is reset. Thereafter the reset pulse RST is turned off. Then, a reset signal indicating a reset level is supplied from the amplifying transistor 227 to the column processing section 113 via the selecting transistor 228 and the vertical signal line 117. The column processing section 113 reads out the reset level on the basis of the reset signal.

The column processing section 113 then performs DDS processing for obtaining a difference between the signal level read out in the D-period and the reset level read out in the P-period, and thereby removes noise from the detected signal level.

Incidentally, when the floating diffusion region 225 is reset, the switching operation of the reset transistor 226 causes random kTC noise (thermal noise). This kTC noise cannot be removed precisely unless a reset level before the signal level is read out is used. In this case, however, the reset level after the signal level is read out is used. Therefore, fixed noise such as an offset error or the like can be removed, but the kTC noise cannot be removed.

In addition, there are many crystal defects and a dark current tends to occur at a Si—SiO$_2$ interface. Thus, when the charge is retained in the floating diffusion region 225, a time during which the charge is retained differs according to order of readout of pixel signals, and there occurs a difference in effect of the dark current on the signal level of each pixel. A difference in noise between pixels due to the difference in effect of the dark current cannot be cancelled out by noise removal using this reset level either.

Thereafter, the selection pulse SEL is turned off, so that the readout period for the unit pixels 211C in the ith row is ended, and a transition is made to a readout period for the unit pixels 211C in the (i+1)th row. After the readout of pixel levels in all rows is completed, a transition is made to the head of the timing chart of FIG. 20 to start an accumulation period for a next frame as required.

Thus, in the unit pixel 211C, as compared with the unit pixel 211A, the kTC noise and the noise due to the dark current are increased, but the area of the light receiving part of the photodiode 221 can be increased. As a result, light receiving sensitivity is improved, and an amount of saturation charge is increased. In addition, an effect of noise occurring as the same phenomenon as the above-described smear can be reduced. The unit pixel 211C is therefore suitable for application to a solid-state image pickup device in which each pixel has a small area and the region of a memory part is difficult to secure.

Incidentally, also in the unit pixel 211C, as in the unit pixel 211B, the insulating film 236 in only a part corresponding to the charge discharging gate 229 may be formed by an oxide film alone.

A few examples of constitution of unit pixels in which the light shielding film 237 can be substituted for the gate electrode of the charge discharging gate 229 as in the unit pixels 211A to 211C will next be introduced briefly with reference to FIGS. 21 to 24.

<4. Fourth Embodiment>

Figure 21:
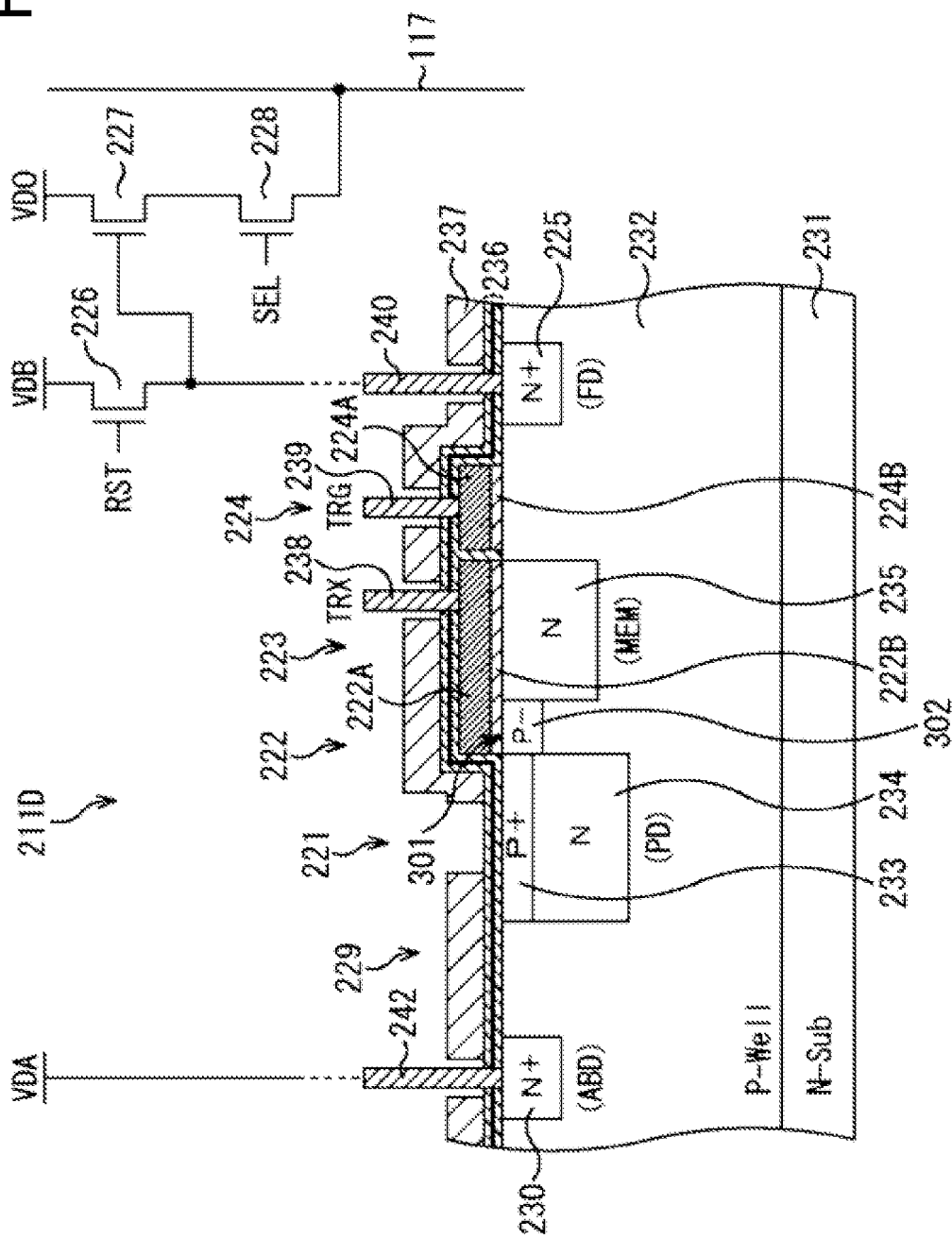
FIG. 21 is a sectional view of an example of constitution of a fourth embodiment of the unit pixel.

FIG. 21 shows a fourth embodiment of the unit pixel, and is a diagram of an example of a sectional constitution of a unit pixel 211D, as with FIG. 8. Incidentally, in FIG. 21, parts corresponding to those of FIG. 8 are identified by the same reference numerals, and repeated description of parts common to the first embodiment will be omitted in the following.

The unit pixel 211D is different from the unit pixel 211A in that the unit pixel 211D has an overflow path 301 formed by providing a P-impurity diffused region 302 under a gate electrode 222A and in a boundary part between a photodiode 221 and a memory part 223.

The potential of the impurity diffused region 302 needs to be lowered to form the overflow path 301. For example, the P-impurity diffused region 302 can be formed by lowering a P-impurity concentration by lightly doping the impurity diffused region 302 with an N-impurity. Alternatively, when the impurity diffused region 302 is doped with a P-impurity at a time of formation of a potential barrier, the P-impurity diffused region 302 can be formed by lowering the concentration of the P-impurity.

In the unit pixel 211D, the overflow path 301 formed in the boundary part between the photodiode 221 and the memory part 223 is used as means for preferentially accumulating a charge generated at a low illuminance in the photodiode 221.

The potential barrier of the boundary part between the photodiode 221 and the memory part 223 is lowered by providing the P-impurity diffused region 302 in the boundary part. The part where the potential barrier is lowered is the overflow path 301. A charge generated in the photodiode 221 and going over the potential barrier of the overflow path 301 automatically leaks into the memory part 223 and is accumulated in the memory part 223. In other words, a generated charge below the potential barrier of the overflow path 301 is accumulated in the photodiode 221.

The overflow path 301 functions as an intermediate charge transfer part. Specifically, the overflow path 301 as an intermediate charge transfer part transfers a charge that is generated by photoelectric conversion in the photodiode 221 and by which a predetermined amount of charge determined by the potential of the overflow path 301 is exceeded as a signal charge to the memory part 223 in an exposure period in which all of a plurality of unit pixels simultaneously perform image pickup operation.

Incidentally, in the example of FIG. 21, the overflow path 301 is formed by providing the P-impurity diffused region 302. However, the overflow path 301 can also be formed by providing an N-impurity diffused region 302 in place of the P-impurity diffused region 302.

<5. Fifth Embodiment>

Figure 22:
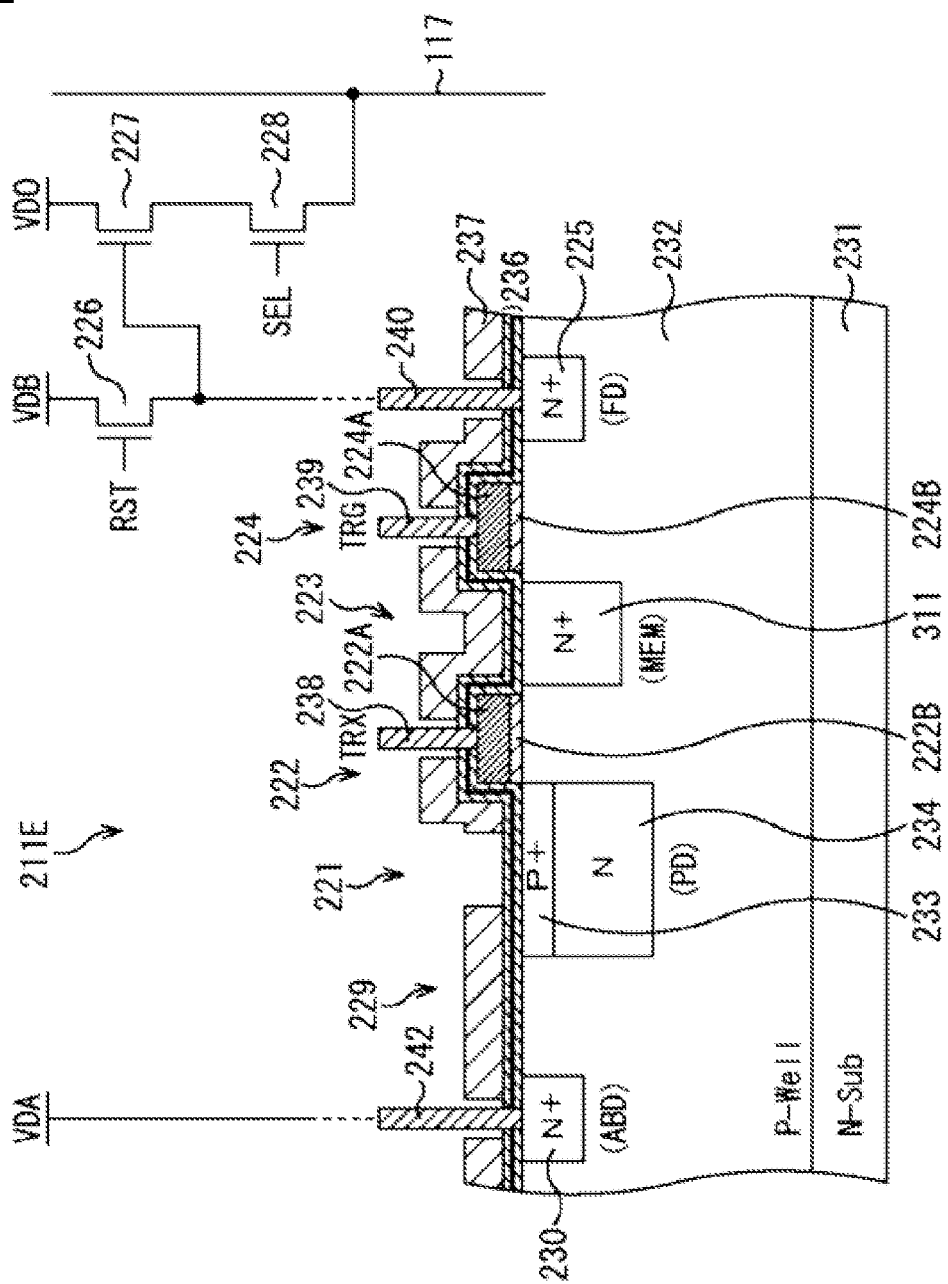
FIG. 22 is a sectional view of an example of constitution of a fifth embodiment of the unit pixel.

FIG. 22 shows a fifth embodiment of the unit pixel, and is a diagram of an example of a sectional constitution of a unit pixel 211E, as with FIG. 8. Incidentally, in FIG. 22, parts corresponding to those of FIG. 8 are identified by the same reference numerals, and repeated description of parts common to the first embodiment will be omitted in the following.

The unit pixel 211E is formed by providing a memory part 223 similar to a floating diffusion region 225 to the constitution of the unit pixel 211A in FIG. 8. Specifically, in the unit pixel 211E, the gate electrode 222A of a first transfer gate 222 is disposed above a P-type well layer 232 at a boundary between a photodiode 221 and the memory part 223. In addition, in the unit pixel 211E, the memory part 223 is formed by an N-type layer 311 similar to that of the floating diffusion region 225.

<6. Sixth Embodiment>

Figure 23:
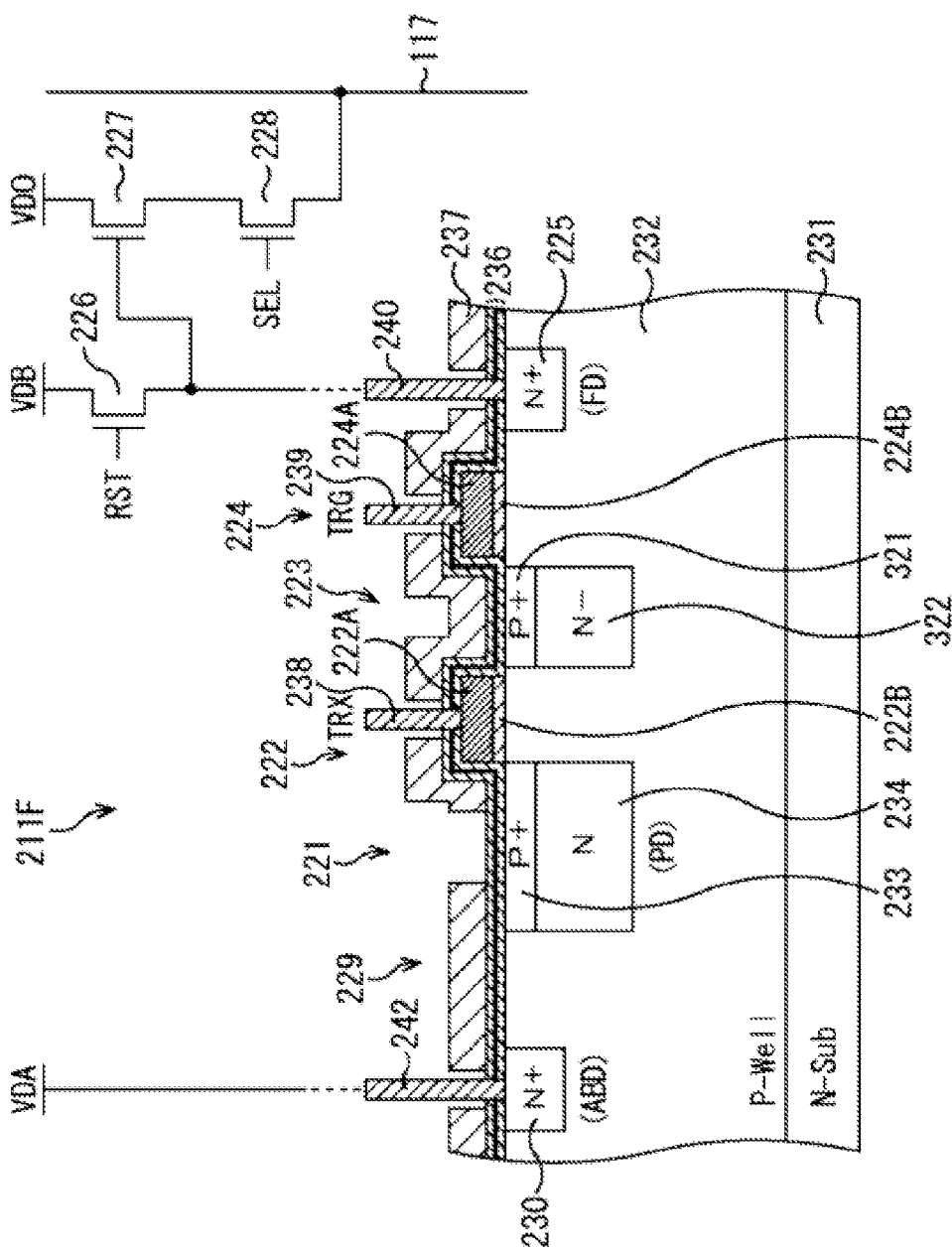
FIG. 23 is a sectional view of an example of constitution of a sixth embodiment of the unit pixel.

FIG. 23 shows a sixth embodiment of the unit pixel, and is a diagram of an example of a sectional constitution of a unit pixel 211F, as with FIG. 8. Incidentally, in FIG. 23, parts corresponding to those of FIG. 8 are identified by the same reference numerals, and repeated description of parts common to the first embodiment will be omitted in the following.

The unit pixel 211A in FIG. 8 has a constitution in which the memory part 223 is formed by the buried channel 235. On the other hand, the unit pixel 211F in FIG. 23 employs a constitution in which a memory part 223 is formed by an N-type diffused region 322 of a buried type.

Action and effect similar to those of the case where the memory part 223 is formed by the buried channel 235 can be obtained also in the case where the memory part 223 is formed by the N-type diffused region 322. Specifically, by forming the N-type diffused region 322 within a P-type well layer 232 and forming a P-type layer 321 on the side of a substrate surface, it is possible to prevent a dark current occurring at a Si—$SiO_2$ interface from being accumulated in the N-type diffused region 322 of the memory part 223, and thus contribute to an improvement in image quality.

In this case, the impurity concentration of the N-type diffused region 322 of the memory part 223 is desirably lower than the impurity concentration of the floating diffusion region 225. Such impurity concentration settings can increase efficiency of charge transfer from the memory part 223 to the floating diffusion region 225 by a second transfer gate 224.

Incidentally, while an example in which the memory part 223 is formed by the N-type diffused region 322 of a buried type has been shown in the above, the memory part 223 may have a constitution that is not of a buried type, though a dark current occurring in the memory part 223 may increase.

<7. Seventh Embodiment>

Figure 24:
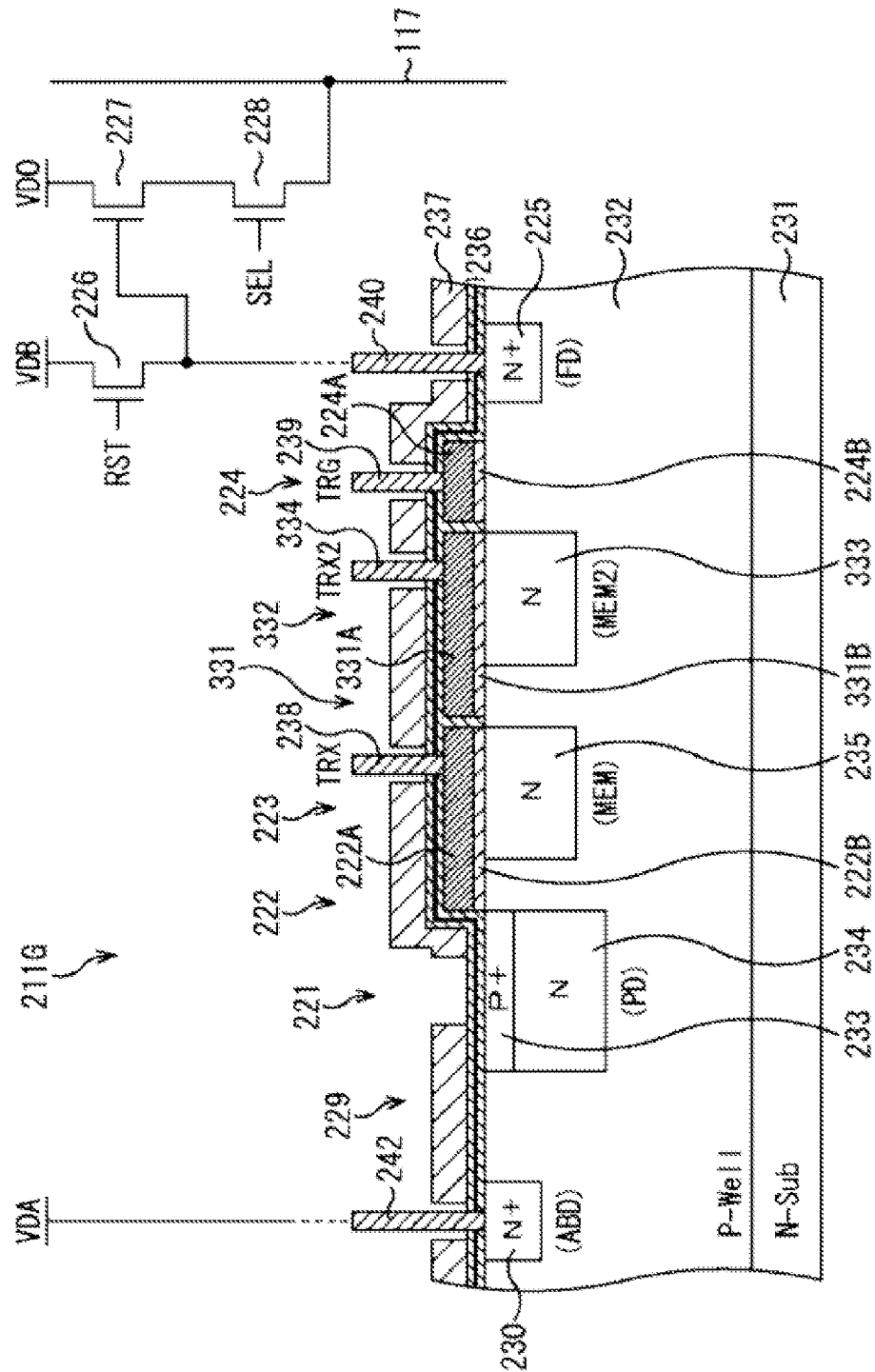
FIG. 24 is a sectional view of an example of constitution of a seventh embodiment of the unit pixel.

FIG. 24 shows a seventh embodiment of the unit pixel, and is a diagram of an example of a sectional constitution of a unit pixel 211G, as with FIG. 8. Incidentally, in FIG. 24, parts corresponding to those of FIG. 8 are identified by the same reference numerals, and repeated description of parts common to the first embodiment will be omitted in the following.

While one memory part (MEM) 223 is disposed between the photodiode 221 and the floating diffusion region 225 in the unit pixel 211A in FIG. 8, another memory part (MEM2) 332 is disposed in the unit pixel 211G in FIG. 24. That is, the memory part has a two-stage constitution. In addition, a contact 334 for wiring is connected to an upper part on the memory part 332 side of the gate electrode 331A of a third transfer gate 331.

The third transfer gate 331 transfers a charge accumulated in the memory part 223 when a transfer pulse TRX2 is applied to the gate electrode 331A formed of polysilicon via the contact 334. The memory part 332 is formed by an N-type buried channel 333 formed under the gate electrode 331A. The memory part 332 accumulates the charge transferred from the memory part 223 by the third transfer gate 331. Because the memory part 332 is formed by the buried channel 333, it is possible to suppress the occurrence of a dark current at a Si—$SiO_2$ interface, and thus contribute to an improvement in image quality.

The memory part 332 has a similar constitution to that of the memory part 223. Thus, as in the memory part 223, an amount of saturation charge of the memory part 332 in the case where modulation is applied can be increased as compared with a case where modulation is not applied.

In global exposure operation of the unit pixel 211G, the charge transferred from the photodiode 221 can be retained in the memory part 223 or the memory part 332. Thus, for example, charges from different exposure periods can be retained in the respective different memory parts.

Incidentally, also in the unit pixels 211D to 211G, as in the unit pixel 211B, an insulating film 236 in only a part corresponding to a charge discharging gate 229 may be formed by an oxide film alone.

<8. Eighth Embodiment>

The above description has been made of an example in which the light shielding film 237 is substituted for the gate electrode of the charge discharging gate 229. However, for example, the light shielding film 237 can be substituted for the gate electrode 222A of the first transfer gate 222.

FIGS. 25 to 30 show an embodiment in which a light shielding film 237 is substituted for the gate electrode of a first transfer gate. Incidentally, as compared with the first embodiment, the eighth embodiment has a different unit pixel constitution, while the constitution of a CMOS image sensor 100 is similar to that of the first embodiment. Repeated description of parts common to the first embodiment will be omitted in the following.

[Example of Constitution of Unit Pixel 211H]

Figure 25:
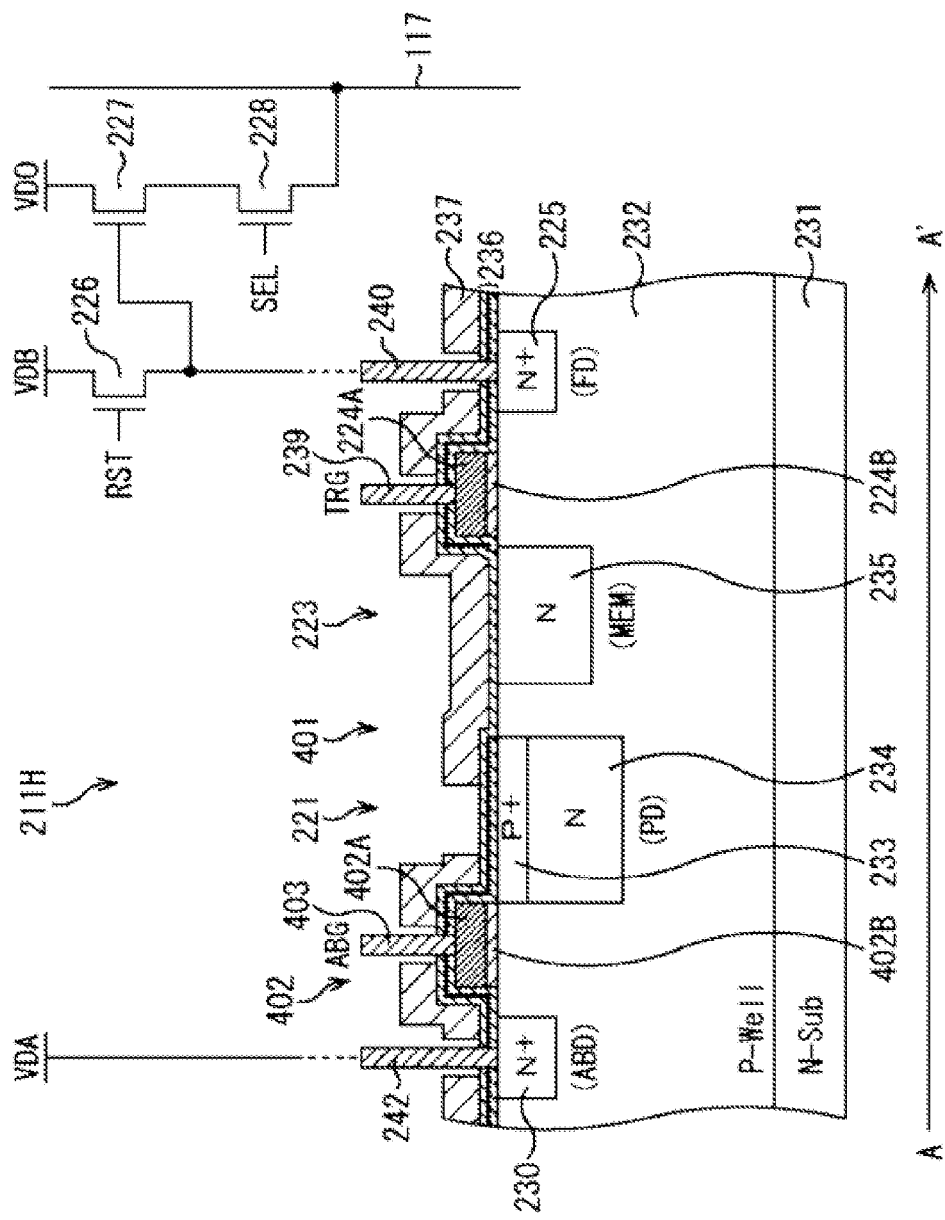
FIG. 25 is a sectional view of an example of constitution of an eighth embodiment of the unit pixel.
Figure 26:
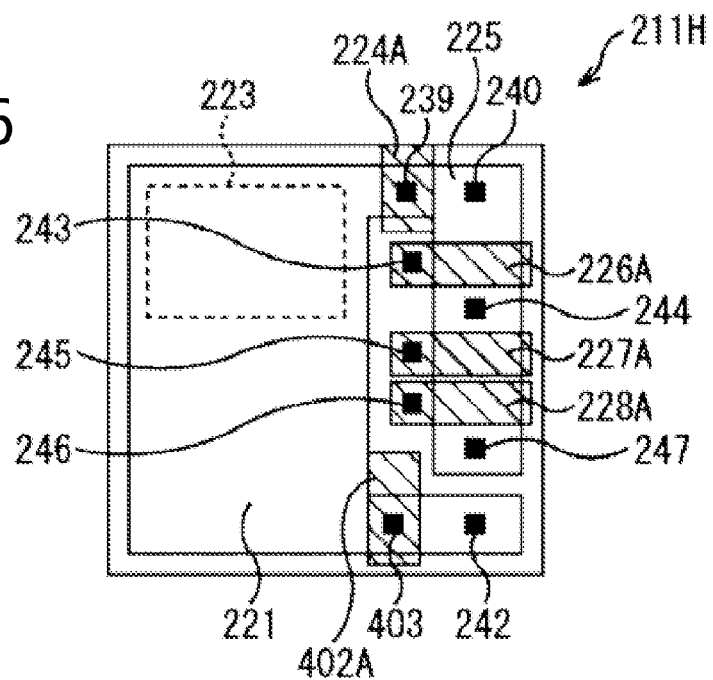
FIG. 26 is a plan view of the example of constitution of the eighth embodiment of the unit pixel.
Figure 27:
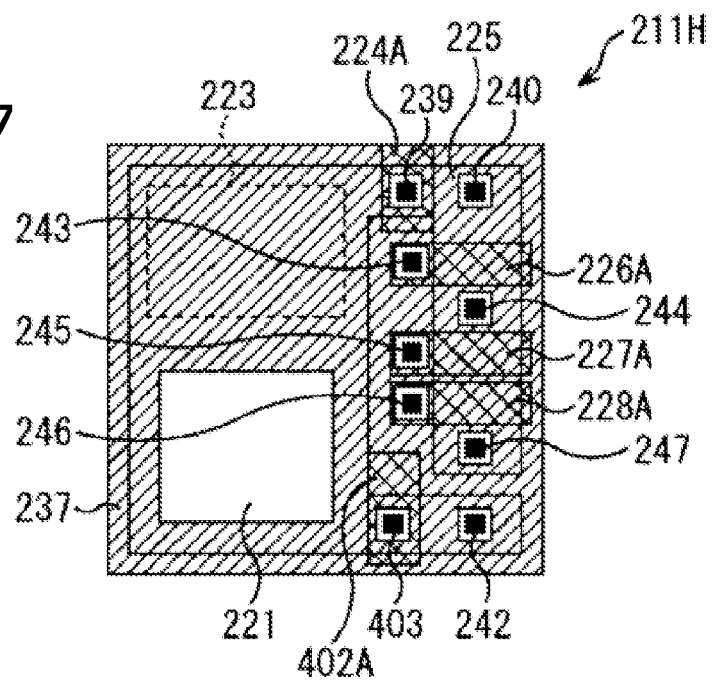
FIG. 27 is a plan view of the example of constitution of the eighth embodiment of the unit pixel.
Figure 28:
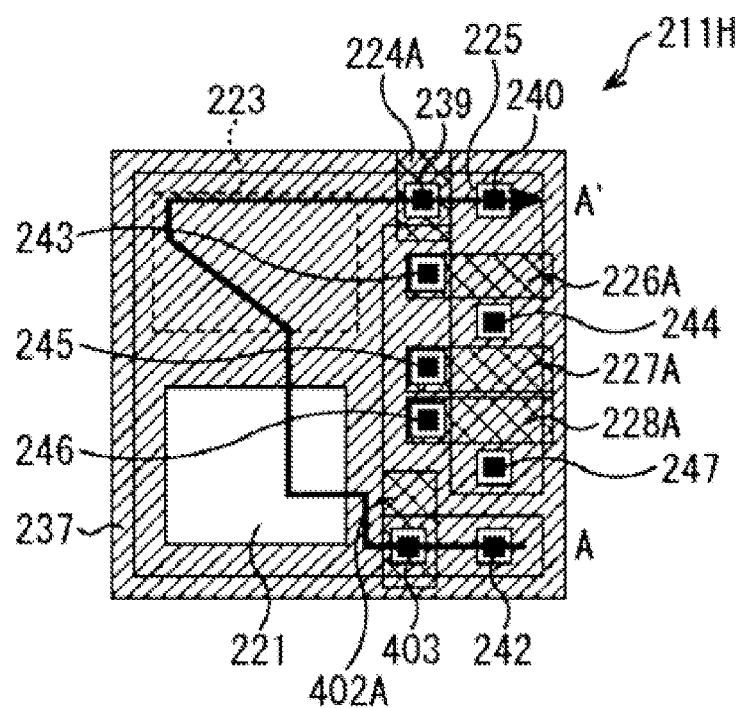
FIG. 28 is a plan view of the example of constitution of the eighth embodiment of the unit pixel.

FIG. 25 shows an example of a sectional constitution of a unit pixel 211H in a direction A-A' shown in FIG. 28. FIG. 26 and FIG. 27 are plan views showing an example of constitution of the unit pixel 211H. However, FIG. 26 shows the constitution excluding a light shielding film 237, and FIG. 27 shows the constitution including the light shielding film 237. Incidentally, FIG. 26 and FIG. 27 do not show an insulating film 236 to facilitate the understanding of the figures. FIG. 28 is a diagram made by adding a path A-A' to FIG. 27. Incidentally, in FIGS. 25 to 28, parts corresponding to those of FIGS. 8 to 11 are identified by the same reference numerals.

The unit pixel 211H in FIG. 25 is different from the unit pixel 211A in FIG. 8 in the following respects. First, the first transfer gate 222 including the gate electrode 222A and the contact 238 are not provided, but a first transfer gate 401 is provided instead. As with the charge discharging gate 229 in the unit pixel 211A, the first transfer gate 401 transfers a charge accumulated in a photodiode 221 when a transfer pulse TRX is applied to the light shielding film 237. That is, in the first transfer gate 401, the light shielding film 237 functions as a gate electrode. Specifically, when the transfer pulse TRX of a positive voltage is applied to the light shielding film 237, the potential of a potential barrier between the photodiode 221 and a memory part 223 is heightened, and the height of the potential barrier is lowered. The potential of the memory part 223 is also heightened. Thereby, an overflow path is formed between the photodiode 221 and the memory part 223, and the charge accumulated in the photodiode 221 is transferred to the memory part 223 whose potential is heightened.

In addition, as in the unit pixel 211B in FIG. 14, a nitride film in a second layer of an insulating film 236 is removed and only an oxide film forms the insulating film 236 in only parts corresponding to the first transfer gate 401 and the memory part 223. Thus, the potential barrier of the first transfer gate 401 and the potential of the memory part 223 are controlled easily.

Further, a charge discharging gate 402 including a gate electrode 402A and an insulating film 402B is provided between the photodiode 221 and a charge discharging part 230, and a contact 403 is connected to an upper part of the gate electrode 402A.

[Example of Constitution of Driving Signal Lines for Unit Pixels 211H]

Figure 29:
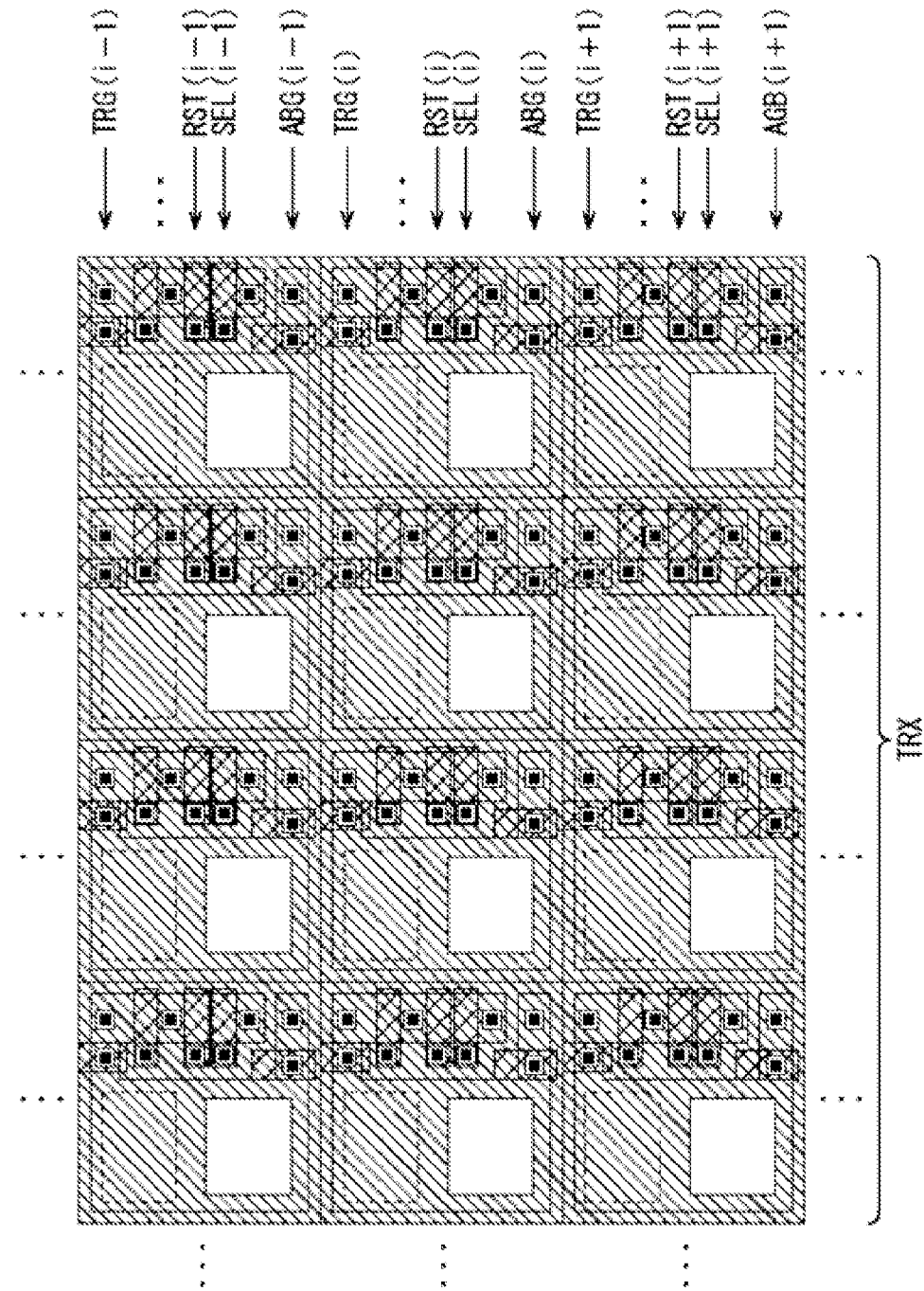
FIG. 29 is a diagram of assistance in explaining an example of constitution of driving signal lines for the eighth embodiment of the unit pixel.

FIG. 29 is a schematic diagram showing an arrangement of the unit pixels 211H in a pixel array section 111. Incidentally, in FIG. 29, description of the reference of each part is omitted to facilitate understanding of the figure.

In the pixel array section 111, the unit pixels 211H are arranged two-dimensionally in a vertical direction (column direction) and a horizontal direction (row direction). In addition, though not shown in FIG. 29, four driving signal lines are provided for each row, the four driving signal lines being a driving signal line TRG for the gate electrode 224A of a second transfer gate 224, a driving signal line RST for the gate electrode 226A of a reset transistor 226, a driving signal line SEL for the gate electrode 228A of a selecting transistor 228, and a driving signal line ABG for the gate electrode 402A of the charge discharging gate 402.

Thus, in the pixel array section 111 in which the unit pixels 211H are arranged, the driving signal line TRX for the gate electrode of the first transfer gate can be omitted as compared with the pixel array section in which the unit pixels 11 are arranged in FIG. 5. A degree of freedom of layout of wiring for the driving signal lines is thereby improved. In addition, an opening area for the light receiving part of the photodiode 221 can be increased, the overall light receiving sensitivity of each pixel is improved, and in particular, the light receiving sensitivity of pixels in the vicinity of an end part of an angle of view where an angle of incidence of incident light is increased is improved. In addition, the shading of the incident light by the driving signal lines is decreased, so that the light receiving sensitivity is further improved.

Further, the need to provide an opening of the light shielding film 237 for the contact for the gate electrode of the first transfer gate is eliminated, so that the light shielding characteristic of the light shielding film 237 is improved. Thereby, an amount of incidence of stray light incident from the openings of the light shielding film 237 is decreased, noise caused by the stray light is decreased, and an S/N ratio is improved.

Incidentally, the light shielding film 237 is for example connected to wiring extending from a vertical driving section 112 in a peripheral part on the outside of the pixel array section 111. The transfer pulse TRX for driving the first transfer gate 401 is applied from the vertical driving section 112 to the light shielding film 237 via the wiring.

[Method of Driving Unit Pixels 211H]

Figure 30:
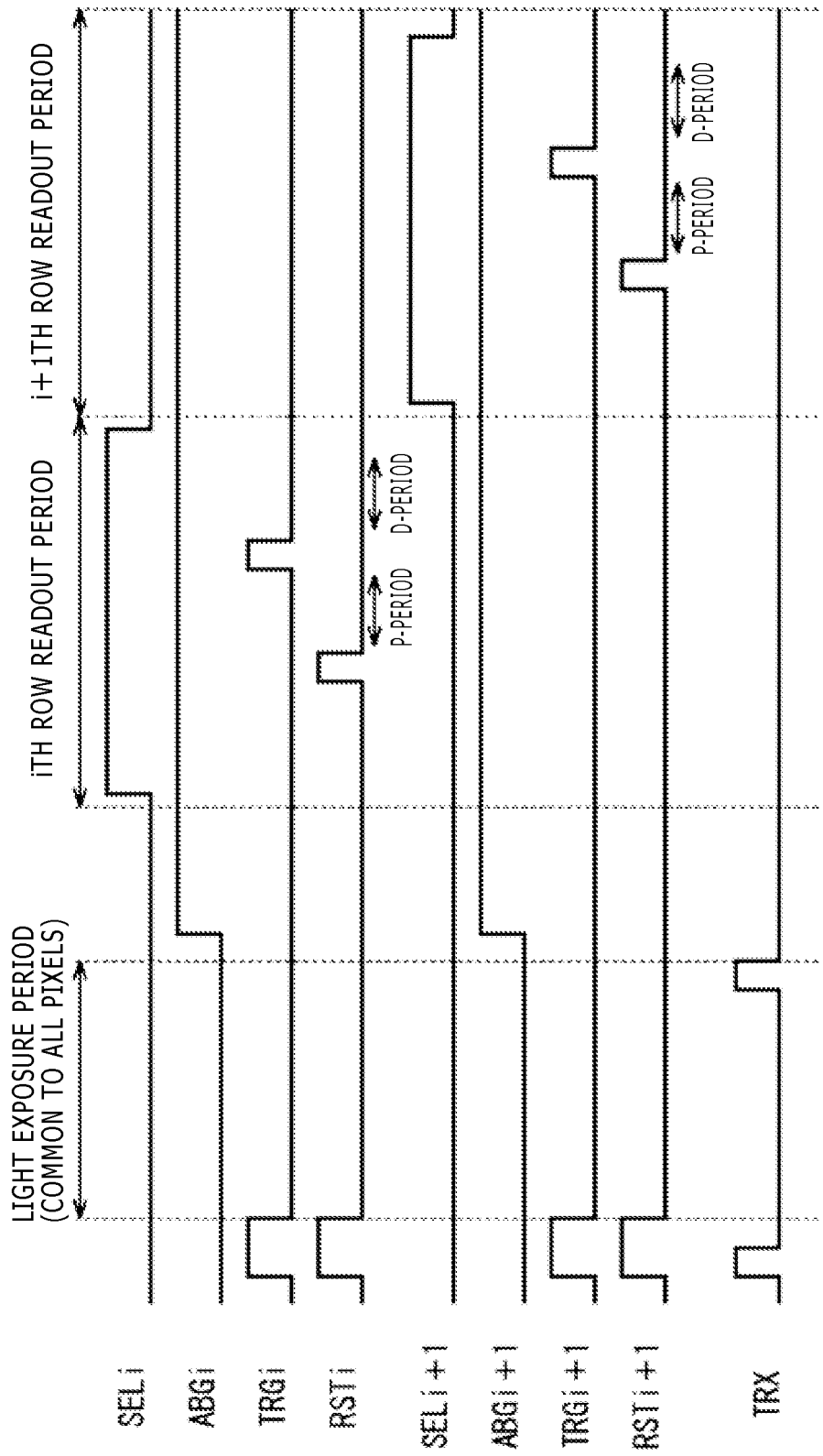
FIG. 30 is a timing chart of assistance in explaining a driving method of the eighth embodiment of the unit pixel.

A method of driving the unit pixels 211H in the CMOS image sensor 100 will next be described with reference to FIG. 30. Incidentally, FIG. 30 is a timing chart of a selection pulse SEL, a control pulse ABG, a transfer pulse TRG, a reset pulse RST, and a transfer pulse TRX for unit pixels 211H in an ith row and an (i+1)th row of the pixel array section 111 in a period of one frame.

First, the transfer pulse TRX is turned on, and the transfer pulse TRG and the reset pulse RST are turned on on an all-pixel simultaneous basis. Thereby, on an all-pixel simultaneous basis, the first transfer gate 401 and the second transfer gate 224 are turned on, and a floating diffusion region 225 is reset. As a result, charges of the photodiode 221, the memory part 223, and the floating diffusion region 225 are discharged. Thereafter, the transfer pulse TRX is first turned off, so that the first transfer gate 401 is turned off on an all-pixel simultaneous basis. Then, the transfer pulse TRG and the reset pulse RST are turned off on an all-pixel simultaneous basis, so that the second transfer gate 224 is turned off. At this point, light exposure is started on an all-pixel simultaneous basis, so that the accumulation of a charge in the photodiode 221 is started. That is, a period of accumulation of a signal charge is started.

Next, after the passage of a predetermined time, the transfer pulse TRX is turned on, and thereby the first transfer gate 401 is turned on on an all-pixel simultaneous basis, so that a charge accumulated in the photodiode 221 is transferred to the memory part 223. Thereafter, the transfer pulse TRX is turned off, so that the first transfer gate 401 is turned off on an all-pixel simultaneous basis, and the light exposure is ended on an all-pixel simultaneous basis.

Next, on an all-pixel simultaneous basis, the control pulse ABG is turned on, and thereby the charge discharging gate 402 is turned on, so that an overflow path from the photodiode 221 to the charge discharging part 230 is formed.

Incidentally, the processes of readout periods are similar to the processes of readout periods of the unit pixels 211A described with reference to FIG. 13, and therefore repeated description thereof will be omitted.

[Example of Modification of Unit Pixels 211H]

When the transfer pulse TRX is applied only from the peripheral part of the pixel array section 111 as described above, a rising edge or a falling edge of the transfer pulse TRX may be faster in unit pixels 211H nearer to the peripheral part of the pixel array section 111 and may be slower in unit pixels 211H nearer to the central part of the pixel array section 111. That is, there may occur a difference in timing of turning on or off the transfer pulse TRX depending on the position of the unit pixel 211H, and there may consequently occur a difference in the control of turning on or off the first transfer gate 401. When the difference becomes large, shading occurs within a photographed image.

An example of a measure against this will be described in the following with reference to FIG. 31 and FIG. 32.

Figure 31:
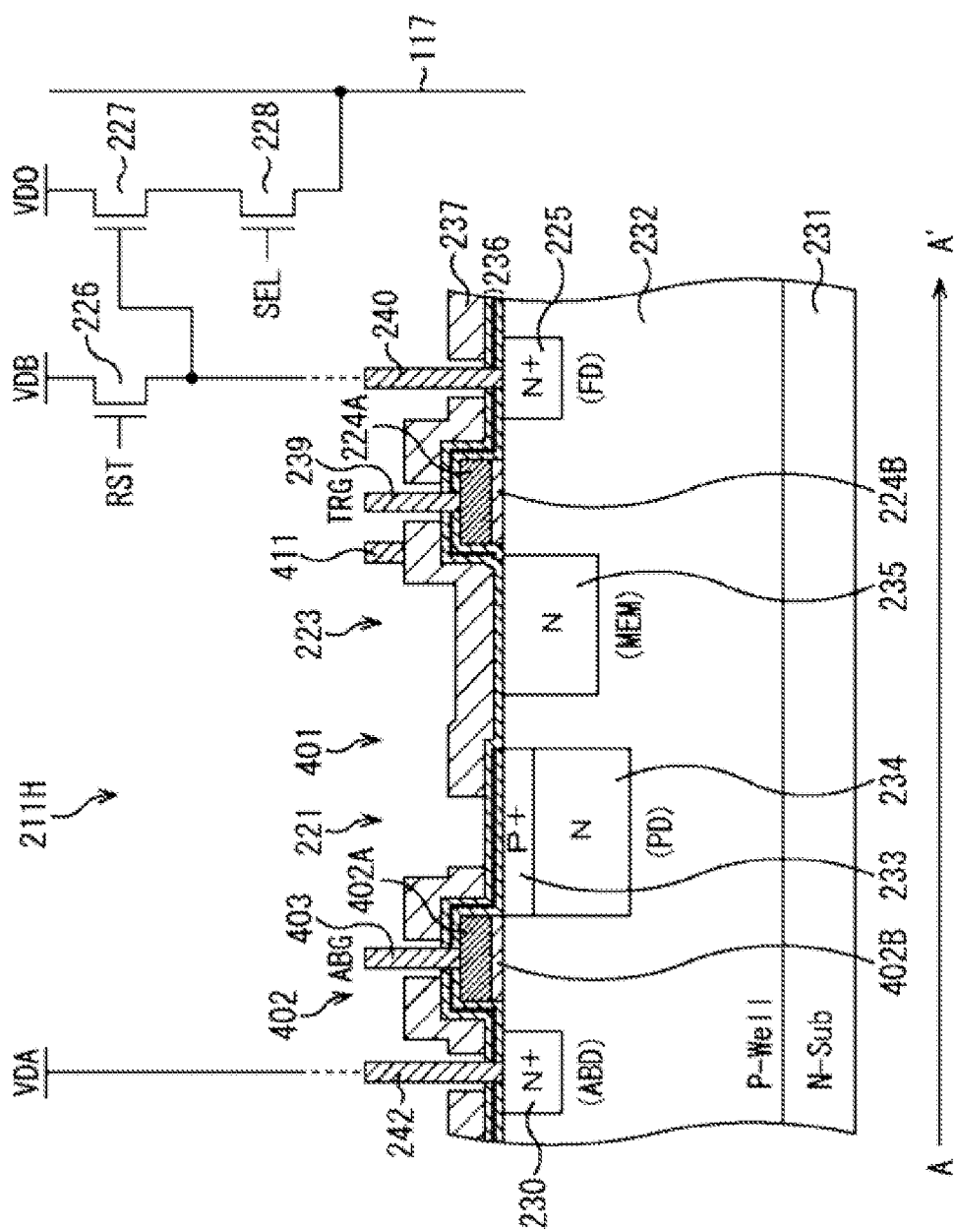
FIG. 31 is a sectional view of an example of modification of the eighth embodiment of the unit pixel.

As with FIG. 25, FIG. 31 shows an example of a sectional constitution of a unit pixel 211H in a direction A-A' shown in FIG. 28.

A comparison between FIG. 31 and FIG. 25 indicates that FIG. 31 and FIG. 25 are different from each other in that a contact 411 is connected to an upper part of a light shielding film 237 on an upper right of a memory part 223 in FIG. 31. FIG. 31 and FIG. 25 are otherwise similar to each other.

Figure 32:
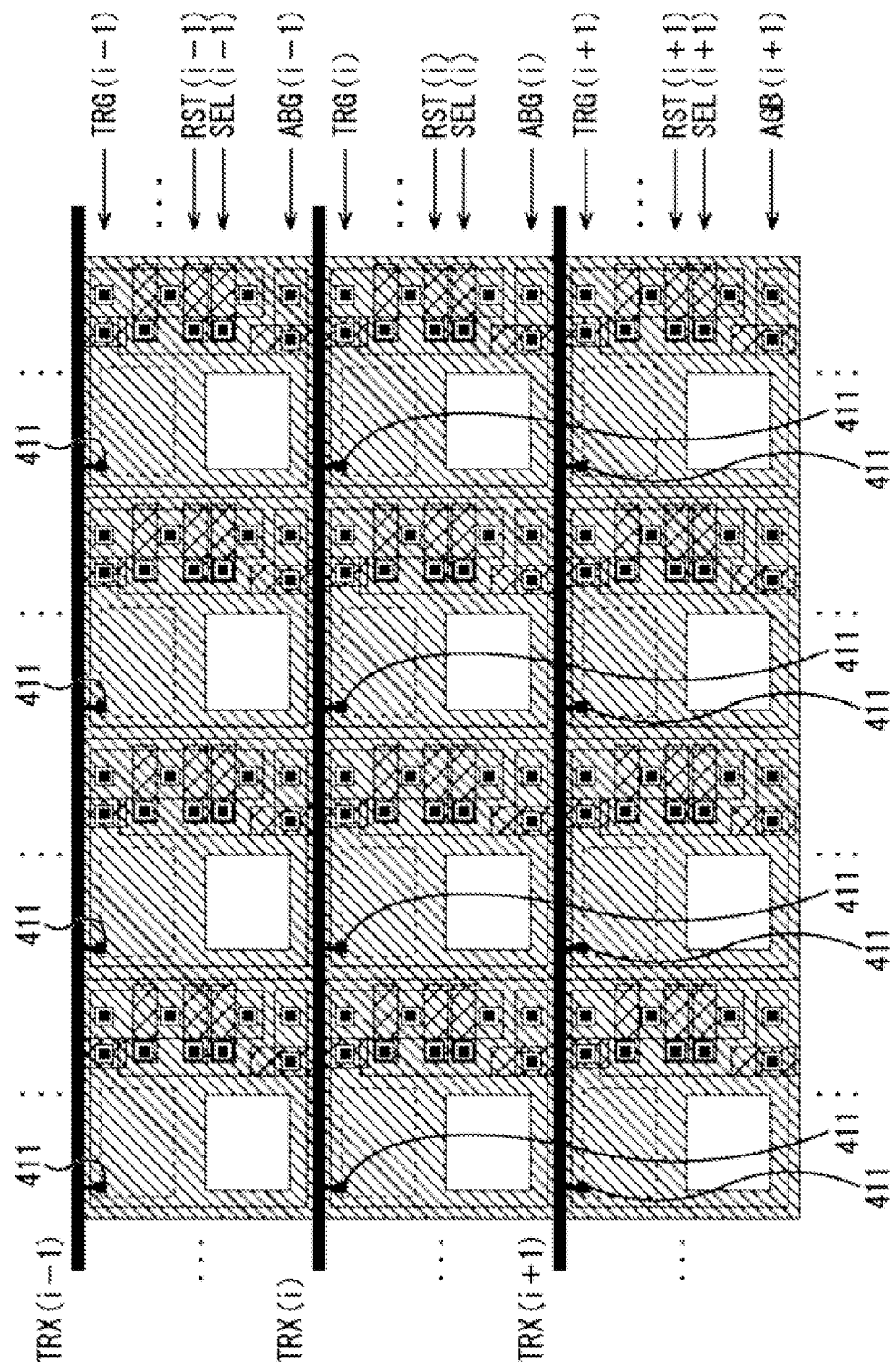
FIG. 32 is a diagram of assistance in explaining an example of constitution of driving signal lines for the example of modification of the eighth embodiment of the unit pixel.

FIG. 32 is a schematic diagram showing an arrangement of the unit pixels 211H of FIG. 31 in a pixel array section 111. Incidentally, in FIG. 32, description of the reference of each part except contacts 411 is omitted to facilitate understanding of the figure.

A comparison between FIG. 32 and FIG. 29 indicates that in FIG. 32, a driving signal line TRX is provided for each row and the driving signal line TRX is shunt connected to the light shielding film 237 via contacts 411. The light shielding film 237 and a vertical driving section 112 are thereby connected to each other in each pixel within the pixel array section 111. It is consequently possible to lower a CR time constant for the transfer pulse TRX, and reduce differences in the timing of turning on or off the first transfer gate 401 between pixels.

Incidentally, in this case, while the number of driving signal lines is the same as in the related-art case of FIG. 5, the number of openings provided in the light shielding film 237 can be reduced, so that the light shielding characteristic of the light shielding film 237 is improved.

<9. Examples of Modification>

While the above description has shown examples in which the present invention is applied to the charge discharging gate and the first transfer gate, the present invention is also applicable to other gates and transistors for transferring a charge. However, when the present invention is applied to a gate or a transistor driving on a row-by-row basis such for example as the reset transistor 226 or the selecting transistor 228, there arises a need to separate the light shielding film for each row. Therefore a gap is formed in the light shielding film in each row, so that the light shielding characteristic is degraded. It is thus desirable to apply the present invention to gates and transistors driven on an all-pixel simultaneous basis, such as the charge discharging gate and the first transfer gate described above as well as the second transfer gate 224 in FIG. 15, the third transfer gate 331 in FIG. 24, and the like.

Incidentally, the charge discharging gate is not required to have high levels of characteristics as compared with the other gates and transistors. For example, when an overflow path can be formed between the photodiode and the charge discharging part, variation in the timing of turning on or off the control pulse ABG or the voltage of the control pulse ABG between pixels do not present much of a problem. It is thus considered that the present invention is most suitably applied to the charge discharging gate.

In addition, the method of connecting the driving signal line in FIG. 32 can be adopted also when the present invention is applied to other gates or transistors. For example, the driving signal line for supplying the control pulse ABG in the first embodiment may be of a configuration as shown in FIG. 32.

Further, when the method of connecting the driving signal line in FIG. 32 is used, the contacts for connecting the driving signal line do not necessarily need to be provided in each unit pixel, and contacts may be arranged to such an extent as to be able to satisfy necessary pulse characteristics.

In addition, elements other than tungsten described above can also be used for the light shielding film 237. However, it is desirable to use elements that have as low an electric resistance as possible and which have excellent light shielding performance and excellent workability.

Incidentally, all pixels in embodiments of the present invention refer to all of pixels of a part appearing in an image, and dummy pixels and the like are excluded. In addition, in embodiments of the present invention, when time difference or image distortion is sufficiently small to such a degree as to present no problem, high-speed scanning in units of a plurality of rows (for example a few ten rows) can be performed instead of all-pixel simultaneous operation. Further, in embodiments of the present invention, it is possible to apply global shutter operation not only to all pixels appearing in an image but also to a predetermined plurality of rows.

In addition, the conduction types of the device structure in the unit pixels 211 shown in the above are a mere example. The N-type and the P-type may be reversed, and the conduction type of the substrate 231 may be either of the N-type and the P-type.

Further, the present invention is not limited to application to solid-state image pickup devices. That is, the present invention is applicable to electronic devices in general using a solid-state image pickup device in an image capturing section (photoelectric converting section), which electronic devices include image pickup devices such as digital still cameras and video cameras, portable terminal devices having an image pickup function, copiers using a solid-state image pickup device in an image reading section, and the like. The solid-state image pickup devices may be formed as one chip, or may be in the form of a module having an image pickup function in which module an image pickup section and a signal processing section or an optical system are collectively packaged.

[Example of Configuration of Electronic Device to which Present Invention is Applied]

Figure 33:
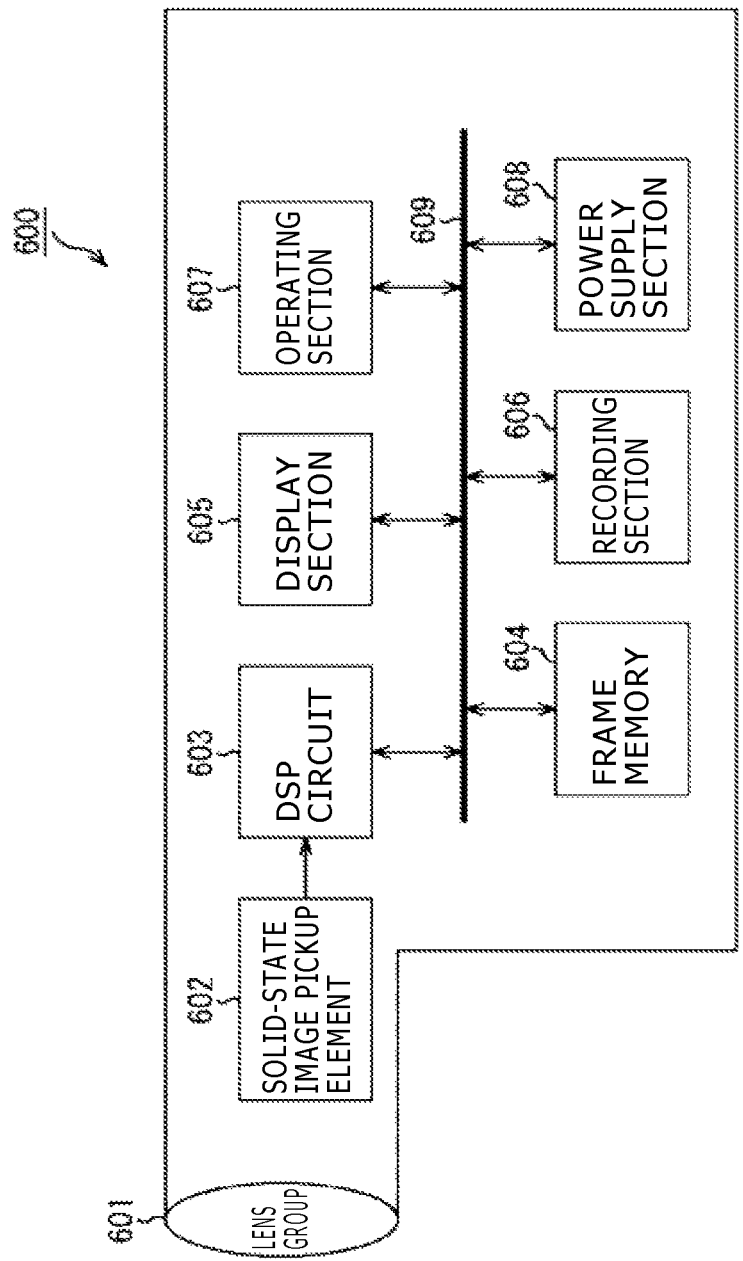
FIG. 33 is a block diagram showing an example of constitution of an embodiment of an electronic device to which the present invention is applied.

FIG. 33 is a block diagram showing an example of configuration of an image pickup device as an electronic device to which the present invention is applied.

The image pickup device 600 of FIG. 33 includes an optical section 601 composed of a lens group and the like, a solid-state image pickup element (image pickup device) 602 employing each of the constitutions of the unit pixels 211 described above, and a DSP (Digital Signal Processor) circuit 603 as a camera signal processing circuit. The image pickup device 600 also includes a frame memory 604, a display section 605, a recording section 606, an operating section 607, and a power supply section 608. The DSP circuit 603, the frame memory 604, the display section 605, the recording section 606, the operating section 607, and the power supply section 608 are interconnected via a bus line 609.

The optical section 601 captures incident light (image light) from a subject, and forms an image on an image pickup surface of the solid-state image pickup element 602. The solid-state image pickup element 602 converts an amount of incident light whose image is formed on the image pickup surface by the optical section 601 into an electric signal in pixel units, and outputs the electric signal as a pixel signal. The solid-state image pickup elements of the CMOS image sensors 100 according to the above-described embodiments or the like, that is, a solid-state image pickup element capable of achieving image pickup free from distortion by global exposure can be used as the solid-state image pickup element 602.

The display section 605 is for example formed by a panel type display device such as a liquid crystal panel or an organic EL (electro luminescence) panel. The display section 605 displays a moving image or a still image picked up by the solid-state image pickup element 602. The recording section 606 records the moving image or the still image picked up by the solid-state image pickup element 602 onto a recoding medium such as a video tape or a DVD (Digital Versatile Disk).

The operating section 607 issues an operation command for various functions of the image pickup device 600 under operation by a user. The power supply section 608 supplies various kinds of power as operating power for the DSP circuit 603, the frame memory 604, the display section 605, the recording section 606, and the operating section 607 to these supply objects as appropriate.

As described above, by using the CMOS image sensors 100 according to the above-described embodiments as the solid-state image pickup element 602, noise caused by variations in threshold value of pixel transistors can be reduced, and therefore a high S/N can be ensured. Thus, the image quality of picked-up images can be enhanced also in the image pickup device 600 such as a video camera or a digital still camera as well as a camera module for a mobile device such as a portable telephone.

In addition, the foregoing embodiments have been described by taking as an example a case where the present invention is applied to a CMOS image sensor formed by arranging unit pixels sensing a signal charge corresponding to an amount of visible light as a physical quantity in the form of a matrix. However, the present invention is not limited to application to CMOS image sensors, but is applicable to solid-state image pickup elements of a column system in general which elements are formed with a column processing section arranged for each pixel column of a pixel array section.

In addition, the present invention is not limited to application to solid-state image pickup devices for sensing a distribution of amounts of incident visible light and picking up the distribution as an image. The present invention is applicable to solid-state image pickup devices for picking up a distribution of amounts of incidence of infrared rays, X-rays, particles or the like as an image and, in a broad sense, solid-state image pickup devices (physical quantity distribution sensing devices) in general including for example fingerprint detecting sensors for sensing a distribution of another physical quantity such as pressure or capacitance, and picking up the distribution as an image.

Embodiments of the present invention are not limited to the above-described embodiments, but various changes can be made without departing from the spirit of the present invention.

The present application contains subject matter related to that disclosed in Japanese Priority Patent Application JP 2010-080525 filed in the Japan Patent Office on Mar. 31, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a plurality of unit pixels each including at least a photoelectric converting section, a charge-to-voltage converting section, a charge discharging section, and one or more transfer means for transferring a charge in either a first predetermined path to the charge-to-voltage converting section or a second predetermined path to the charge discharging section:
a light shielding film for shielding a surface of said plurality of unit pixels excluding at least a light receiving section of said photoelectric converting sections from light; and
voltage controlling means for controlling a voltage applied to said light shielding film;
wherein,
transfer of the charge by one of said transfer means is controlled by (i) applying a control pulse to said light shielding film, and (ii) controlling a potential barrier having a variable height based on the control pulse applied to said light shielding film, and
the voltage controlling means causes the charge to be transferred to the charge discharging section along the second predetermined path if a photodiode saturates during a readout period after an end of light exposure.

2. The solid-state image pickup device according to claim 1, wherein:
each unit pixel includes transfer means for transferring the charge from the photoelectric converting section to the charge-to-voltage converting section, and
for each unit pixel, transfer of a charge by the transfer means for transferring the charge from the photoelectric converting section to the charge-to-voltage converting section is controlling by controlling the voltage applied to said light shielding film.

3. The solid-state image pickup device according to claim 1, wherein:
each of said unit pixels further includes a charge retaining section and transfer means for transferring the charge from said photoelectric converting section to the charge retaining section, and for each unit pixel, transfer of a charge by the transfer means for transferring the charge from said photoelectric converting section to the charge retaining section is controlled by controlling the voltage applied to said light shielding film.

4. The solid-state image pickup device according to claim 1, comprising an insulating film formed of an oxide film and a nitride film disposed between said light shielding film and a semiconductor substrate in which said unit pixels are formed, wherein,
only a portion of said insulating film between a part of said light shielding film forming one of the transfer means and said semiconductor substrate is formed of an oxide film alone.

5. The solid-state image pickup device according to claim 1, further comprising wiring for connecting said light shielding film and said voltage controlling means to each other on an outside of a pixel array section in which said plurality of unit pixels are arranged, and applying the voltage to said light shielding film.

6. The solid-state image pickup device according to claim 1, further comprising wiring for connecting said light shielding film and said voltage controlling means to each other within a pixel array section in which said plurality of unit pixels are arranged, and applying the voltage to said light shielding film.

7. A method for driving a solid-state image pickup device, the solid-state image pickup device including (a) a plurality of unit pixels each including at least a photoelectric converting section, a charge-to-voltage converting section, a charge discharging section, and one or more transfer means for transferring charge in either a first predetermined path to the charge-to-voltage converting section or a second predetermined path to the charge discharging section, (b) a light shielding film for shielding a surface of said plurality of unit pixels excluding at least a light receiving section of said photoelectric converting section from light, and (c) voltage controlling means for controlling a voltage applied to said light shielding film, the method comprising:
controlling transfer of charge by one of said transfer means by (i) applying a control pulse to said light shielding film, and (ii) controlling a potential barrier having a variable height based on the control pulse applied to said light shielding film,
wherein the voltage controlling means causes the charge to be transferred to the charge discharging section along the second predetermined path if a photodiode saturates during a readout period after an end of light exposure.

8. The method for driving the solid-state image pickup device according to claim 7, comprising controlling transfer of a charge by transfer means for transferring the charge from said photoelectric converting section to said charge discharging section by controlling the voltage applied to said light shielding film.

9. The method for driving the solid-state image pickup device according to claim 7, comprising controlling transfer of a charge by transfer means for transferring the charge from said photoelectric converting section to a charge retaining section by controlling the voltage applied to said light shielding film.

10. An electronic device comprising a solid-state image pickup device, the solid-state image pickup device including:
a plurality of unit pixels each including at least a photoelectric converting section, a charge-to-voltage converting section, a charge discharging section, and one or more transfer means for transferring a charge in either a first predetermined path to the charge-to-voltage converting section or a second predetermined path to the charge discharging section;

a light shielding film for shielding a surface of said plurality of unit pixels excluding at least a light receiving section of said photoelectric converting section from light; and voltage controlling means for controlling a voltage applied to said light shielding film, wherein,
- the solid-state image pickup device controls transfer of the charge by one of said transfer means by (i) applying a control pulse to said light shielding film, and (ii) controlling a potential barrier having a variable height based on the control pulse applied to said light shielding film, and
- the voltage controlling means causes the charge to be transferred to the charge discharging section along the second predetermined path if a photodiode saturates during a readout period after an end of light exposure.

* * * * *